(12) United States Patent
Ryu et al.

(10) Patent No.: US 10,529,859 B2
(45) Date of Patent: Jan. 7, 2020

(54) MULTI-CHANNEL TRANSISTOR INCLUDING AN ASYMMETRICAL SOURCE/DRAIN CONTACT

(71) Applicant: Samsung Electronics Co., Ltd., Suwon-si (KR)

(72) Inventors: Byung Chan Ryu, Seongnam-si (KR); Jong Ho You, Seongnam-si (KR); Hyung Jong Lee, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/988,623

(22) Filed: May 24, 2018

(65) Prior Publication Data

US 2019/0148538 A1    May 16, 2019

(30) Foreign Application Priority Data

Nov. 10, 2017    (KR) .................. 10-2017-0149656

(51) Int. Cl.
*H01L 29/78*    (2006.01)
*H01L 29/417*    (2006.01)
(Continued)

(52) U.S. Cl.
CPC ...... *H01L 29/785* (2013.01); *H01L 21/76877* (2013.01); *H01L 21/823431* (2013.01); *H01L 23/5226* (2013.01); *H01L 27/0886* (2013.01); *H01L 29/41791* (2013.01); *H01L 29/66795* (2013.01); *H01L 29/7848* (2013.01); *H01L 2029/7858* (2013.01)

(58) Field of Classification Search
CPC ............. H01L 29/785; H01L 29/41791; H01L 23/5226; H01L 27/0886; H01L 29/66795; H01L 21/823431; H01L 29/7848; H01L 21/76877; H01L 2029/7858
See application file for complete search history.

(56) References Cited

U.S. PATENT DOCUMENTS 9,508,821 B2    11/2016    Bohr et al.
9,704,970 B2    7/2017    Chiang et al.
(Continued)

FOREIGN PATENT DOCUMENTS

JP    2011192744 A    9/2011
KR    20160106819 A    9/2016
(Continued)

*Primary Examiner* — Sonya D. McCall-Shepard
(74) *Attorney, Agent, or Firm* — Myers Bigel, P.A.

(57) ABSTRACT

A semiconductor device includes a lower interlayer insulating film including a first trench and a second trench adjacent each other; a first gate structure within the first trench and extending in a first direction; a second gate structure within the second trench and extending in the first direction; a source/drain adjacent the first gate structure and the second gate structure; an upper interlayer insulating film on the lower interlayer insulating film; and a contact connected to the source/drain, the contact in the upper interlayer insulating film and the lower interlayer insulating film, wherein the contact includes a first side wall and a second side wall, the first side wall of the contact and the second side wall of the contact are asymmetric with each other, and the contact does not vertically overlap the first gate structure and the second gate structure.

20 Claims, 20 Drawing Sheets

(51) Int. Cl.
*H01L 23/522* (2006.01)
*H01L 27/088* (2006.01)
*H01L 29/66* (2006.01)
*H01L 21/8234* (2006.01)
*H01L 21/768* (2006.01)
*H01L 29/165* (2006.01)

(56) References Cited

U.S. PATENT DOCUMENTS

| | | |
|---|---|---|
| 9,876,094 B2 | 1/2018 | Bae et al. |
| 2016/0260669 A1 | 9/2016 | Paak et al. |
| 2016/0284697 A1* | 9/2016 | Yoon .................... H01L 27/088 |
| 2016/0308016 A1 | 10/2016 | Choi et al. |
| 2017/0162444 A1 | 6/2017 | Ok et al. |
| 2017/0207122 A1 | 7/2017 | Park et al. |

FOREIGN PATENT DOCUMENTS

| | | |
|---|---|---|
| KR | 20160136579 A | 11/2016 |
| WO | WO 2011/111133 A1 | 9/2011 |

* cited by examiner

MULTI-CHANNEL TRANSISTOR INCLUDING AN ASYMMETRICAL SOURCE/DRAIN CONTACT

This U.S. nonprovisional patent application claims priority under 35 U.S.C § 119 to Korean Patent Application No. 10-2017-0149656, filed on Nov. 10, 2017, in the Korean Intellectual Property Office, the entire contents of which are incorporated herein by reference.

BACKGROUND

1. Field of the Inventive Concepts

The present inventive concepts relate to semiconductor devices.

2. Description of the Related Art

Multi-gate transistor may be used as part of the scaling techniques for increasing the density of a semiconductor device. A multi-gate transistor may include a fin-shaped silicon body that is formed on a substrate and a gate may be formed on the silicon body.

Since such a multi-gate transistor uses a three-dimensional channel, scaling is easier to accomplish. Further, with the multi-gate transistor, current control capability can be improved without increasing the gate length of the multi-gate transistor. Moreover, a short channel effect (SCE) in which the potential of a channel region is affected by a drain voltage can be effectively reduced and/or suppressed.

SUMMARY

An aspect of the present inventive concepts is to provide semiconductor devices having improved operational performance and reliability.

According to the present inventive concepts, a semiconductor device comprises: a lower interlayer insulating film comprising a first trench and a second trench adjacent each other; a first gate structure within the first trench and extending in a first direction; a second gate structure within the second trench and extending in the first direction; a source/drain adjacent the first gate structure and the second gate structure; an upper interlayer insulating film on the lower interlayer insulating film; and a contact connected to the source/drain, the contact in the upper interlayer insulating film and the lower interlayer insulating film, wherein the contact comprises a first side wall and a second side wall that is opposite the first side wall, the first side wall of the contact and the second side wall of the contact are asymmetric with each other, and the contact does not vertically overlap the first gate structure and the second gate structure.

According to the present inventive concepts, a semiconductor device comprises: a first fin-shape pattern on a substrate and extending in a first direction; a lower interlayer insulating film on the substrate and comprising a first trench and a second trench, wherein each of the first trench and the second trench extends in a second direction different from the first direction and intersects the first fin-shaped pattern; a first gate structure within the first trench; a second gate structure within the second trench; a first source/drain on the first fin-shape pattern and adjacent the first gate structure and the second gate structure; an upper interlayer insulating film on the lower interlayer insulating film; and a first contact connected to the first source/drain, the first contact in the upper interlayer insulating film and the lower interlayer insulating film, wherein the first contact is between a side wall of the first gate structure and a side wall of the second gate structure, the side walls facing each other, and between a first line extending from the side wall of the first gate structure that is perpendicular to an upper surface of the first gate structure and a second line extending from the side wall of the second gate structure that is perpendicular to an upper surface of the second gate structure, wherein the first contact comprises a first side wall facing the first gate structure and a second side wall facing the second gate structure, wherein the first contact comprises a first portion and a second portion on the first portion, wherein the second portion of the first contact protrudes in the first direction from a first extension line that extends substantially collinearly from the first side wall of the first portion of the first contact, and wherein the second portion of the first contact does not protrude in the first direction from a second extension line that extends substantially collinearly from the second side wall of the first portion of the first contact.

According to the present inventive concepts, a semiconductor device comprises: a first fin-shaped pattern and a second fin-shaped pattern adjacent each other on a substrate, wherein the first fin-shaped pattern and the second fin-shaped pattern each extend in a first direction; a first gate structure on the first fin-shaped pattern and the second fin-shaped pattern and extending in a second direction different from the first direction; a second gate structure on the first fin-shaped pattern and the second fin-shaped pattern and extending in the second direction; a first source/drain on the first fin-shaped pattern and adjacent the first gate structure and the second gate structure; a second source/drain on the second fin-shaped pattern and adjacent the first gate structure and the second gate structure; and a contact connected to the first source/drain and the second source/drain and on the first source/drain and the second source/drain, wherein the contact is between a side wall of the first gate structure and a side wall of the second gate structure, the side walls facing each other, and between a first line extending from the side wall of the first gate structure that is perpendicular to an upper surface of the first gate structure and a second line extending from the side wall of the second gate structure that is perpendicular to an upper surface of the second gate structure, wherein the contact comprises a first side wall facing the first gate structure along the first direction and a second side wall facing the second gate structure along the first direction, wherein the contact comprises a first portion and a second portion on the first portion, wherein the second portion of the contact protrudes in the first direction from a first extension line that extends substantially collinearly from the first side wall of the first portion of the contact, and the second portion of the contact does not protrude in the first direction from a second extension line that extends substantially collinearly from the second side wall of the first portion of the contact.

However, aspects of the present inventive concepts are not restricted to those set forth herein. The above and other aspects of the present inventive concepts will become more apparent to one of ordinary skill in the art to which the present inventive concepts pertain by referencing the detailed description of the present inventive concepts given below.

BRIEF DESCRIPTION OF THE DRAWINGS

The above and other aspects and features of the present inventive concepts will become more apparent by describing in detail example embodiments thereof with reference to the attached drawings, in which.

DETAILED DESCRIPTION

Figure 1:
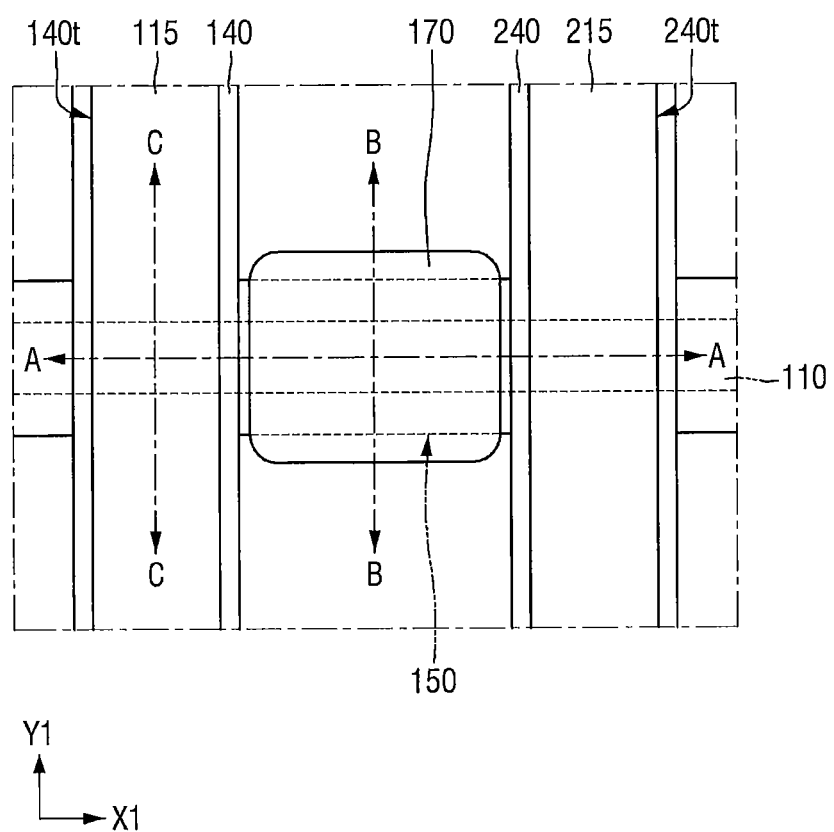
FIG. 1 is a plan view of a semiconductor device according to an embodiment of the present inventive concepts.

In the drawings related to a semiconductor device according to some embodiments of the present inventive concepts, a fin-shaped transistor FinFET including a channel region having a fin-shaped pattern is shown, but the present inventive concepts are not limited thereto. The semiconductor devices according to some embodiments of the present inventive concepts may include a tunneling transistor, a transistor including nanowires, a transistor including nanosheets, or a three-dimensional (3D) transistor. The semiconductor devices according to some embodiments may also include a bipolar junction transistor, a laterally diffused metal oxide semiconductor (LDMOS) transistor, or the like.

In addition, although the semiconductor devices according to some embodiments of the present inventive concepts are described as a multi-channel transistor using a fin-shaped pattern, they may also include a planar transistor.

Figure 2:
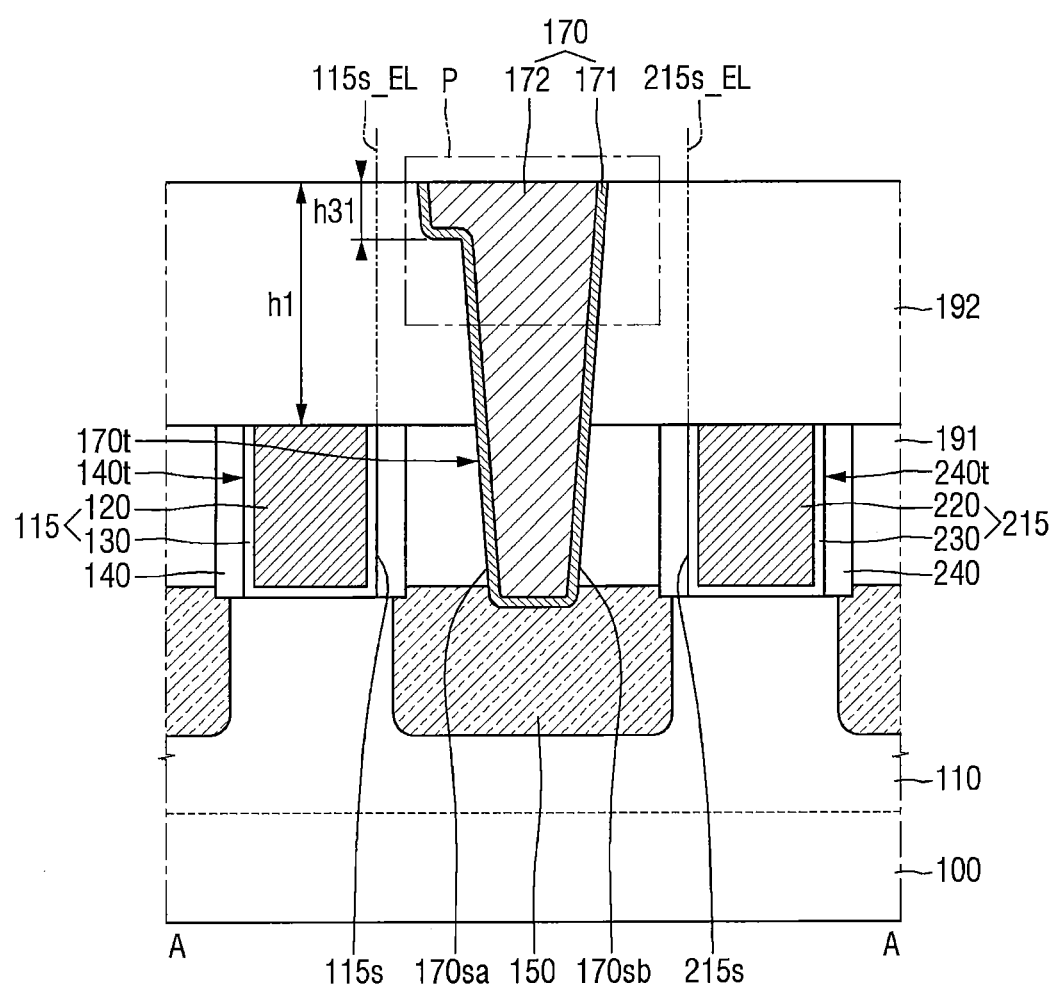
FIG. 2 is a cross-sectional view taken along the line A-A of FIG. 1.
Figure 3:
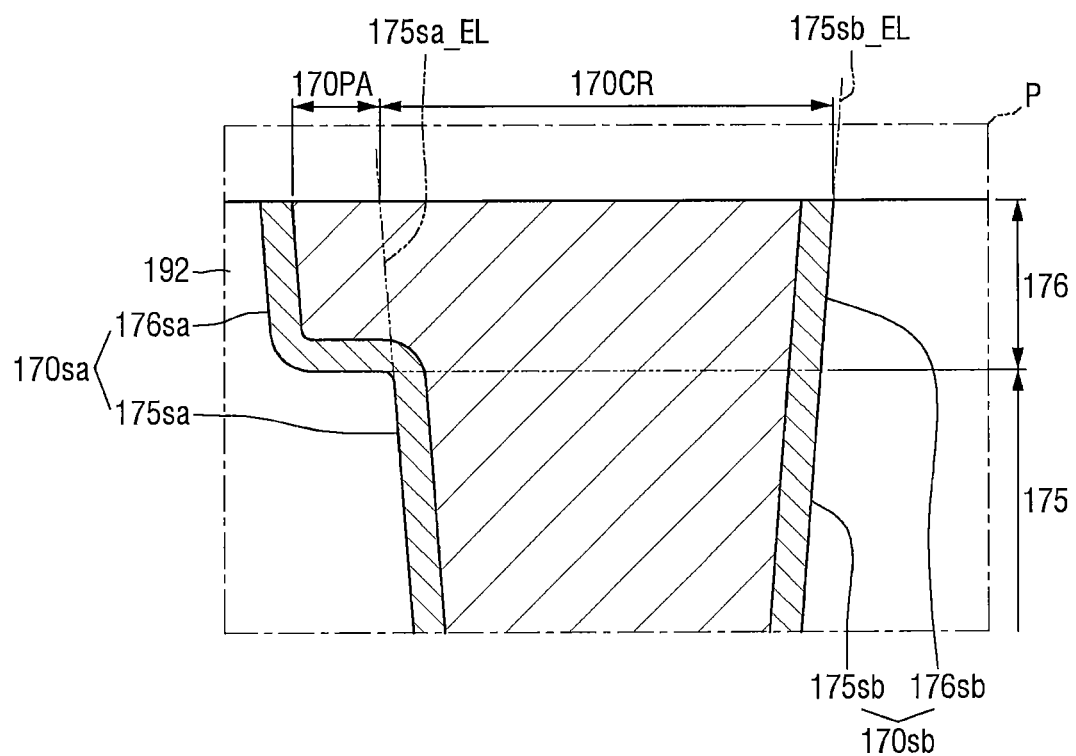
FIG. 3 is an enlarged view of the portion P of FIG. 2.
Figure 4:
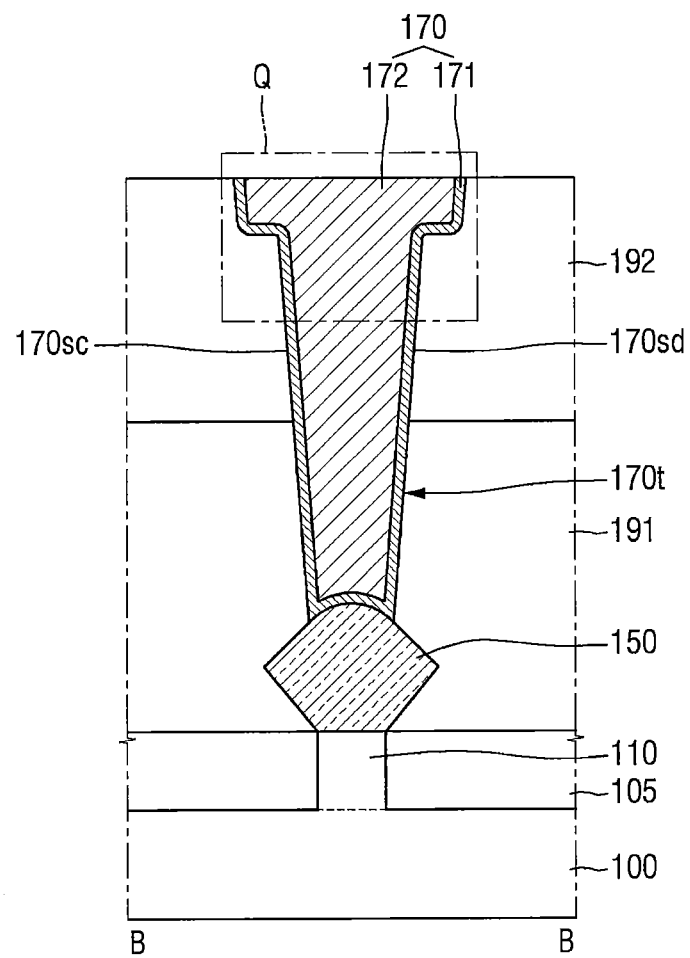
FIG. 4 is a cross-sectional view taken along the line B-B of FIG. 1.
Figure 5:
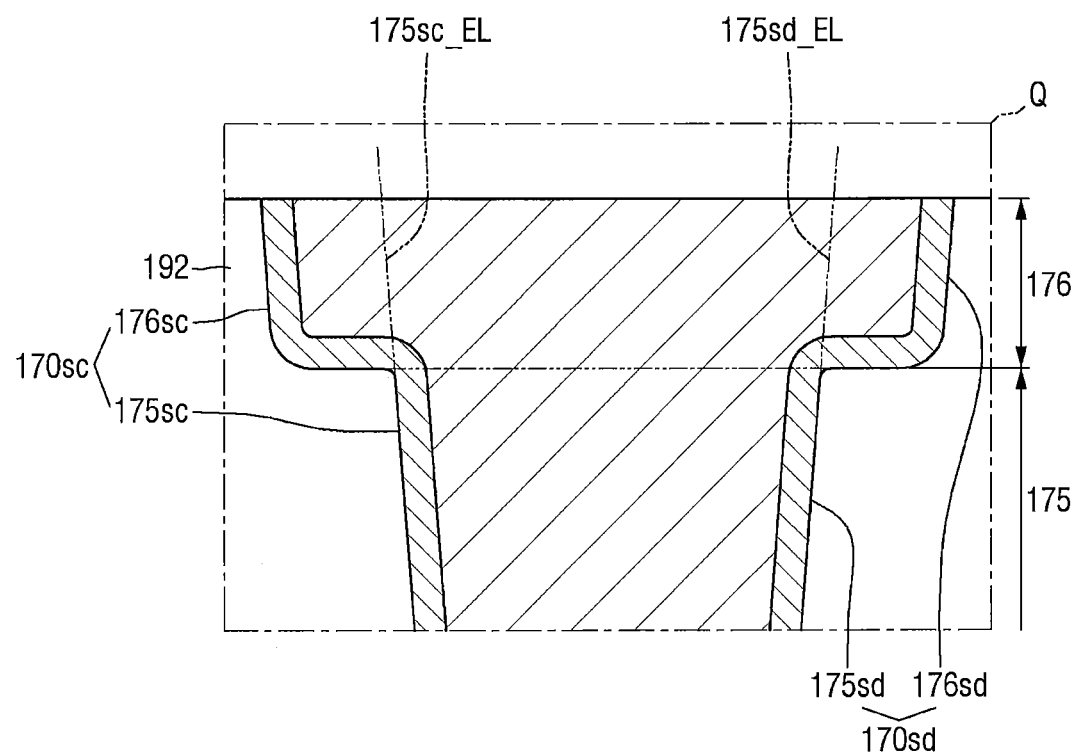
FIG. 5 is an enlarged view of the portion Q of FIG. 4.
Figure 6:
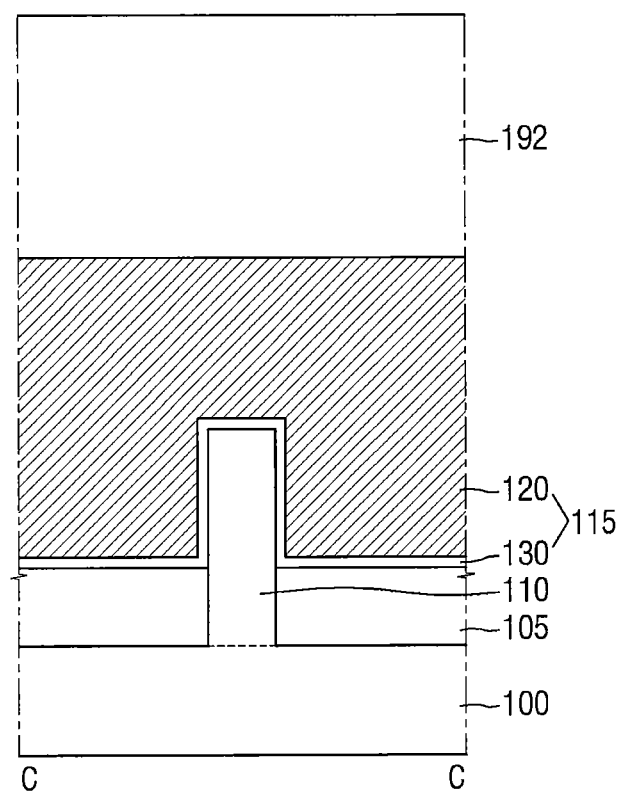
FIG. 6 is a cross-sectional view taken along the line C-C of FIG. 1.

FIG. 1 is a plan view of a semiconductor device according to an embodiment of the present inventive concepts. FIG. 2 is a cross-sectional view taken along the line A-A of FIG. 1. FIG. 3 is an enlarged view of the portion P of FIG. 2. FIG. 4 is a cross-sectional view taken along the line B-B of FIG. 1. FIG. 5 is an enlarged view of the portion Q of FIG. 4. FIG. 6 is a cross-sectional view taken along the line C-C of FIG. 1.

For convenience of explanation, a lower interlayer insulating film 191 and an upper interlayer insulating film 192 are not shown in FIG. 1.

Referring to FIGS. 1 to 6, a semiconductor device according to an embodiment of the present inventive concepts may include a first fin-shaped pattern 110, a first gate structure 115, a second gate structure 215, a first gate spacer 140, a second gate spacer 240, a first source/drain 150, and a first contact 170.

The first fin-shape pattern 110 may protrude from a substrate 100. The substrate 100 may be a bulk silicon substrate or a silicon-on-insulator (SOI) substrate. In some embodiments, the substrate may be a silicon substrate, and may include, but is not limited to, other materials such as silicon germanium, silicon germanium on insulator (SGOI), indium antimonide, a lead telluride compound, indium arsenic, indium phosphide, gallium arsenic, and/or gallium antimonide.

The first fin-shaped pattern 110 may extend on the substrate along a first direction X1. For example, the first fin-shaped pattern 110 may include a long side extending in the first direction X1 and a short side extending in a second direction Y1.

The first fin-shaped pattern 110 may be part of the substrate 100, and may include an epitaxial layer grown from the substrate 100. The first fin-shaped pattern 110 may include material that is an elemental semiconductor material, for example, silicon and/or germanium. Further, the first fin-shaped pattern 110 may include a compound semiconductor, and may include, for example, a Group IV-IV compound semiconductor or a Group III-V compound semiconductor.

Specifically, taking the Group IV-IV group semiconductor as an example, the first fin-shaped pattern 110 may include a binary compound or a ternary compound, or the binary compound or the ternary compound doped with a Group IV element, which contains at least two of carbon (C), silicon (Si), germanium (Ge), and/or tin (Sn).

Taking the Group III-V group semiconductor as an example, the first fin-shaped pattern 110 may include a binary compound or a ternary compound, or a quaternary compound, which is combined with at least one Group III element selected from aluminum (Al), gallium (Ga), and indium (In), and at least one group V element selected from phosphorus (P), arsenic (As), and antimony (Sb).

In a semiconductor pattern according to some embodiments of the present inventive concepts, the first fin-shaped pattern 110 will be described as a silicon fin-shaped pattern including silicon, but the present inventive concepts are not limited thereto.

A field insulating film 105 may be formed on the substrate 100. The field insulating film 105 may cover a part of the first fin-shaped pattern 110. For example, the field insulating film 105 may cover a part of the side wall of the first fin-shaped pattern 110.

The upper surface of the first fin-shaped pattern 110 may protrude above the upper surface of the field insulating film 105 formed adjacent to the long side of the first fin-shaped pattern 110. The first fin-shaped pattern 110 may be defined by the field insulating film 105 on the substrate 100.

The field insulating film 105, for example, may include at least one of a silicon oxide film, a silicon nitride film, and/or a silicon oxynitride film.

The field insulating film 105 may further include at least one field liner film formed between the first fin-shaped pattern 110 and the field insulating film 105. When the field insulating film 105 further includes a field liner film, the field liner film may include at least one of polysilicon, amorphous silicon, silicon oxynitride, silicon nitride, and/or silicon oxide.

A lower interlayer insulating film 191 may be formed on the substrate 100. The lower interlayer insulating film 191 may cover the field insulating film 105. The lower interlayer insulating film 191 may include a first trench 140t and a second trench 240t, which are adjacent to each other.

The first trench 140t and the second trench 240t may extend in the second direction Y1. The first trench 140t and the second trench 240t may intersect the first fin-shaped pattern 110.

An upper interlayer insulating film 192 may be formed on the lower interlayer insulating film 191. For example, each of the lower interlayer insulating film 191 and the upper interlayer insulating film 192 may include silicon oxide, silicon nitride, silicon oxynitride, FOX (Flowable Oxide), TOSZ (Tonen SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, or a combination thereof. However, the present inventive concepts are not limited thereto.

A first gate spacer 140 and a second gate spacer 240 may be formed on the field insulating film 105 and the first fin-shaped pattern 110. Each of the first gate spacer 140 and the second gate spacer 240 may extend in the second direction Y1.

The first gate spacer 140 may define the first trench 140t. The second gate spacer 240 may define the second trench 240t.

The outer side wall of the first gate spacer 140 and the outer side wall of the second gate spacer 240 may be adjacent the lower interlayer insulating film 191, respectively. For example, the upper surface of the first gate spacer 140 and the upper surface of the second gate spacer 240 may be flush (e.g., coplanar) with the upper surface of the lower interlayer insulating film 191. The upper interlayer insulating film 192 may be formed on the first gate spacer 140 and the second gate spacer 240.

For example, each of the first gate spacer 140 and the second gate spacer 240 may include at least one of silicon nitride (SiN), silicon oxynitride (SiON), silicon oxide (SiO$_2$), and silicon oxycarbonitride (SiOCN), and combinations thereof.

Although the first gate spacer 140 and the second gate spacer 240 are shown as a single film, the present inventive concepts are not limited thereto. In some embodiments, one or more of the first gate spacer 140 and the second gate spacer 240 may have a multi-film structure.

The first gate structure 115 may be formed in the first trench 140t. The first gate structure 115 may be within and, in some embodiments, fill, the first trench 140t. The first gate structure 115 may extend along the second direction Y1. The upper surface of the first gate structure 115 may be flush with the upper surface of the lower interlayer insulating film 191.

The first gate structure 115 may be formed on the first fin-shaped pattern 110 and the field insulating film 105. The first gate structure 115 may intersect the first fin-shaped pattern 110. The first gate structure 115 may include a first gate insulating film 130 and a first gate electrode 120.

The first gate insulating film 130 may be formed along the side wall and bottom surface of the first trench 140t. The first gate insulating film 130 may be formed along the profile of the first fin-shaped pattern 110 protruding above the field insulating film 105 and the upper surface of the field insulating film 105.

The first gate electrode 120 may be formed on the first gate insulating film 130. The first gate electrode 120 may cover portions of the first fin-shaped pattern 110 protruding above the upper surface of the field insulating film 105.

The second gate structure 215 may be formed in the second trench 240t. The second gate structure 215 may be within and, in some embodiments, fill, the second trench 240t. The second gate structure 215 may extend along the second direction Y1. The second gate structure 215 may be formed adjacent the first gate structure 115. The upper surface of the second gate structure 215 may be flush with the upper surface of the lower interlayer insulating film 191.

The second gate structure 215 may be formed on the first fin-shaped pattern 110 and the field insulating film 105. The second gate structure 215 may intersect the first fin-shaped pattern 110. The second gate structure 215 may include a second gate insulating film 230 and a second gate electrode 220.

The second gate insulating film 230 may be formed along the side wall and bottom surface of the second trench 240t. The second gate insulating film 230 may be formed along the profile of the first fin-shaped pattern 110 protruding above the field insulating film 105 and the upper surface of the field insulating film 105.

The second gate electrode 220 may be formed on the second gate insulating film 230. The second gate electrode 220 may cover portions of the first fin-shaped pattern 110 protruding above the upper surface of the field insulating film 105.

In some embodiments, interfacial layers (not shown) may be further formed between the first gate insulating film 130 and the first fin-shaped pattern 110 and/or between the second gate insulating film 230 and the first fin-shaped pattern 110, respectively.

When the first fin-shaped pattern 110 is a silicon fin-shaped pattern, the interfacial layer, for example, may include silicon oxide. The interfacial layer may be changed depending on the material included in the first fin-shaped pattern 110.

Each of the first gate electrode 120 and the second gate electrode 220 may include at least one selected from titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlCN), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. Each of the first gate electrode 120 and the second gate electrode 220 may include a conductive metal oxide, a conductive metal oxynitride, or the like, and may include oxidized forms of the above-described materials.

Each of the first gate electrode 120 and the second gate electrode 220 may include a high-K dielectric material having a higher dielectric constant than a silicon oxide film. For example, each of the first gate electrode 120 and the second gate electrode 220 may include at least one selected from hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate.

The first source/drain 150 may be formed between and/or adjacent the first gate structure 115 and the second gate structure 215. The first source/drain 150, for example, may include an epitaxial pattern grown by an epitaxial process. The first source/drain 150 may be disposed on the first fin-shaped pattern 110.

As an example, when the first fin-shaped pattern 110 includes a channel region of a PMOS transistor, the first source/drain 150 may include a compressive stress material. For example, the compressive stress material may be a material having a larger lattice constant than Si, for example, SiGe. The compressive stress material can improve the mobility of carriers in the channel region by applying compressive stress to the first fin-shaped pattern 110.

As another example, when the first fin-shaped pattern 110 includes a channel region of an NMOS transistor, the first source/drain 150 may include a tensile stress material. For example, when the first fin-shaped pattern 110 includes Si, the tensile stress material may be a material having a smaller lattice constant than Si, for example, SiC. The tensile stress material can improve the mobility of carriers in the channel region by applying tensile stress to the first fin-shaped pattern 110. Or, when the first fin-shaped pattern 110 includes Si, the first source/drain 150 may include a silicon epitaxial pattern.

In some embodiments, the first source/drain 150 may not include an epitaxial pattern, but may be a high concentration impurity region formed by doping a p-type impurity or an n-type impurity into the first fin-shaped pattern 110.

The first contact 170 may be formed on the first source/drain 150. The first contact 170 may be electrically and/or physically connected with the first source/drain 150.

The first contact 170 may be formed in the upper interlayer insulating film 192 and the lower interlayer insulating film 191. The first contact 170 may be within and, in some embodiments, fill, a first contact hole 170*t* formed in the upper interlayer insulating film 192 and the lower interlayer insulating film 191.

The first contact 170 may include a first barrier conductive film 171 and a first filling conductive film 172. The first filling conductive film 172 may be formed on the first barrier conductive film 171.

The first contact 170 may be an integral structure. For example, the first barrier conductive film 171 and the first filling conductive film 172 may be formed at the same level, respectively. Here, the "same level" means that the first barrier conductive film 171 and the first filling conductive film 172 are the same structures formed in the same step of a manufacturing process.

The first contact 170 may be disposed between the side wall 115*s* of the first gate structure 115 and the side wall 215*s* of the second gate structure 215 and between the extension line 115*s*_EL of the side wall 115*s* of the first gate structure 115 and the extension line 215*s*_EL of the side wall 215*s* of the second gate structure 215. A part of the first contact 170 may be disposed between the side wall 115*s* of the first gate structure 115 and the side wall 215*s* of the second gate structure 215, and the remainder of the first contact 170 may be disposed between the extension line 115*s*_EL of the side wall 115*s* of the first gate structure 115 and the extension line 215*s*_EL of the side wall 215*s* of the second gate structure 215.

The extension line 115*s*_EL of the side wall 115*s* of the first gate structure 115 may be defined as a line extending from the side wall 115*s* of the first gate structure 115 and perpendicular to the upper surface of the first gate structure 115. Similarly, the extension line 215*s*_EL of the side wall 215*s* of the second gate structure 215 may be defined as a line extending from the side wall 215*s* of the second gate structure 215 and perpendicular to the upper surface of the second gate structure 215.

In the semiconductor device according to some embodiments of the present inventive concepts, from the viewpoint of a plan view, the first contact 170 does not overlap, in a vertical direction, the first gate structure 115 and the second gate structure 215. Further, the first contact 170 may not overlap, in a vertical direction, at least a part of the first gate spacer 140 and at least a part of the second gate spacer 240.

For example, in FIG. 1, the first contact 170 may not overlap, in a vertical direction, the first gate spacer 140 and the second gate spacer 240. From a plan view, the first contact 170 may not include a portion overlapping, in a vertical direction, the upper surface of the first gate spacer 140 and the upper surface of the second gate spacer 240.

The first barrier conductive film 171 may be formed along the profile of the first contact hole 170*t*. The first filling conductive film 172 may fill the recess space defined by the first barrier conductive film 171. Although it is shown in FIG. 1 that the cross section of the first contact 170 intersecting the X1-Y1 plane is a rectangle with rounded corners, this configuration is only for convenience of explanation, and is not limited thereto.

The first barrier conductive film 171 may include at least one of tantalum (Ta), tantalum nitride (TaN), titanium (Ti), titanium nitride (TiN), tungsten nitride (WN), and/or tungsten carbonitride (WCN). The first filling conductive film 172 may include at least one of tungsten (W), cobalt (Co), ruthenium (Ru), molybdenum (Mo), nickel (Ni), aluminum (Al), copper (Cu), and/or doped polysilicon.

The shape of the first contact 170 will be described with reference to the cross-sectional view taken along the first direction X1 using FIGS. 2 and 3. The cross-sectional view taken in the first direction X1 may be a view taken in a direction in which the first fin-shaped pattern 110 extends.

In the cross-sectional view taken in the first direction X1, the first contact 170 may include a first side wall 170*sa* and a second side wall 170*sb* facing each other. The first side wall 170*sa* of the first contact 170 may be adjacent the first gate structure 115, and the second side wall 170*sb* of the first contact 170 may be adjacent the second gate structure 215. The first side wall 170*sa* of the first contact 170 may face the side wall 115*s* of the first gate structure 115, and the second side wall 170*sb* of the first contact 170 may face the side wall 215*s* of the second gate structure 215.

In the semiconductor device according to some embodiments of the present inventive concepts, the first side wall 170*sa* of the first contact 170 and the second side wall 170*sb* of the first contact 170 are asymmetric with each other.

As an example, the first contact 170 may include a first portion 175 disposed on the first source/drain 150 and a second portion 176 on the first portion 175 of the first contact 170.

The first side wall 170sa of the first contact 170 may include a first side wall 175sa of the first portion 175 of the first contact 170 and a first side wall 176sa of the second portion 176 of the first contact 170. As used herein, the first side wall 175sa of the first portion 175 of the first contact 170 may refer to the portion of the first side wall 170sa within the first portion 175 of the first contact 170. The first side wall 176sa of the second portion 176 of the first contact 170 may refer to the portion of the first side wall 170sa within the second portion 176 of the first contact 170. The second side wall 170sb of the first contact 170 may include a second side wall 175sb of the first portion 175 of the first contact 170 and a second side wall 176sb of the second portion 176 of the first contact 170. As used herein, the second side wall 175sb of the first portion 175 of the first contact 170 may refer to the portion of the second side wall 170sb within the first portion 175 of the first contact 170. The second side wall 176sb of the second portion 176 of the first contact 170 may refer to the portion of the second side wall 170sb within the second portion 176 of the first contact 170.

The second portion 176 of the first contact 170 protrudes from the extension line 175sa_EL of the first side wall 175sa of the first portion 175 of the first contact 170 in the first direction X1. In other words, the second portion 176 of the first contact 170 protrudes from the extension line 175sa_EL of the first side wall 175sa of the first portion 175 of the first contact 170 toward the side wall 115s of the first gate structure 115 in the first direction X1.

In contrast, the second portion 176 of the first contact 170 does not protrude from the extension line 175sb_EL of the second side wall 175sb of the first portion 175 of the first contact 170 in the first direction X1. In other words, the second portion 176 of the first contact 170 does not protrude from the extension line 175sb_EL of the second side wall 175sb of the first portion 175 of the first contact 170 toward the side wall 215s of the second gate structure 215 in the first direction X1.

The extension line 175sa_EL of the first side wall 175sa of the first portion 175 of the first contact 170 may be in parallel with the first side wall 175sa of the first portion 175 of the first contact 170. In some embodiments, the extension line 175sa_EL of the first side wall 175sa of the first portion 175 of the first contact 170 may extend substantially collinearly from the first side wall 175sa. The extension line 175sb_EL of the second side wall 175sb of the first portion 175 of the first contact 170 may be in parallel with the second side wall 175sb of the first portion 175 of the first contact 170. In some embodiments, the extension line 175sb_EL of the second side wall 175sb of the first portion 175 of the first contact 170 may extend substantially collinearly from (e.g., be collinear with) the second side wall 175sb of the first portion 175 of the first contact 170.

Although it is shown in FIG. 3 that the extension line 175sb_EL of the second side wall 175sb of the first portion 175 of the first contact 170 is aligned on the same line as the second side wall 176sb of the second portion 176 of the first contact 170, the present inventive concepts are not limited thereto.

Portions of the first portion 175 of the first contact 170 may be disposed between the side wall 115s of the first gate structure 115 and the side wall 215s of the second gate structure 215 and between the extension line 115s_EL of the side wall 115s of the first gate structure 115 and the extension line 215s_EL of the side wall 215s of the second gate structure 215. The first portion 175 of the first contact 170 may be disposed in the lower interlayer insulating film 191 and the upper interlayer insulating film 192.

The second portion 176 of the first contact 170 may not be disposed between the side wall 115s of the first gate structure 115 and the side wall 215s of the second gate structure 215, and may be disposed between the extension line 115s_EL of the side wall 115s of the first gate structure 115 and the extension line 215s_EL of the side wall 215s of the second gate structure 215. The second portion 176 of the first contact 170 may disposed only in the upper interlayer insulating film 192. That is, the second portion 176 of the first contact 170 may be disposed above the upper surface of the first gate structure 115 and the upper surface of the second gate structure 215.

In the semiconductor device according to some embodiments of the present inventive concepts, the height h31 of the second portion 176 of the first contact 170 (e.g., a distance between a lowermost surface of the second portion 176 and an upper surface of the first contact 170) may be smaller than the distance h1 from the upper surface of the first contact 170 to the upper surface of the first gate structure 115. In other words, the height h1-h31 from the upper surface of the first gate structure 115 to the second portion 176 of the first contact 170 is greater than zero.

As another example, the first contact 170 may include a central portion 170CR and a first protrusion portion 170PA protruding from the central portion 170CR.

The central portion 170CR of the first contact 170 may be disposed in the lower interlayer insulating film 191 and the upper interlayer insulating film 192. The central portion 170CR of the first contact 170 may extend from the first source/drain 150 to the upper surface of the upper interlayer insulating film 192. The side wall of the central portion 170CR of the first contact 170 may not include an inflection point.

The central portion 170CR of the first contact 170 may be defined by the side walls 175sa and 175sb of the first portion 175 of the first contact 170 and the extension lines 175sa_EL of the side wall 175sa and 175sb_EL of the side wall 175sb of the first portion 175 of the first contact 170.

The first protrusion portion 170PA of the first contact 170 may be disposed only in the upper interlayer insulating film 192. The first protrusion portion 170PA of the first contact 170 may protrude from the central portion 170CR of the first contact 170 toward the first gate structure 115 in the first direction X1.

The first contact 170 may not include a protrusion portion that protrudes from the central portion 170CR of the first contact 170 toward the second gate structure 215 in the first direction X1.

As can be seen illustrated in FIGS. 2 and 3, the first side wall 170sa of the first contact 170 may include a lower portion on the first portion 175 of the first contact 170 (e.g., a portion of the first side wall 175sa of the first portion 175 of the first contact 170) and an upper portion on the second portion 176 of the first contact 170 (e.g., a portion of the first side wall 176sa of the second portion 176 of the first contact 170). The upper portion of the first side wall 170sa may be connected to the lower portion of the first side wall 170sa by an intermediate portion of the first side wall 170sa. The upper portion of the first side wall 170sa and the lower portion of the first side wall 170sa may extend substantially vertically (e.g., having a slope with an absolute value greater than 1, but the present inventive concepts are not limited thereto). The intermediate portion of the first side wall 170*sa* may extend substantially horizontally (e.g., having a slope with an absolute value less than 1, but the present inventive concepts are not limited thereto) to connect the upper portion and the lower portion of the first side wall 170*sa*. As can also be seen illustrated in FIGS. 2 and 3, the second side wall 170*sb* of the first contact may not have the intermediate portion of the second side wall 170*sb* extending substantially horizontally. In some embodiments, all of the second side wall 170*sb* may extend substantially vertically (e.g., having a slope with an absolute value of greater than 1, but the present inventive concepts are not limited thereto).

Next, the shape of the first contact 170 will be described in the cross-sectional view taken along the second direction Y1 with reference to FIGS. 4 and 5. The cross-sectional view taken in the second direction Y1 may be a view where the semiconductor device is taken in a direction in which the first gate electrode 120 or the second gate electrode 220 extends.

In the cross-sectional view taken in the second direction Y1, the first contact 170 may include a third side wall 170*sc* and a fourth side wall 170*sd* facing each other.

The third side wall 170*sc* of the first contact 170 may include a third side wall 175*sc* of the first portion 175 of the first contact 170 and a third side wall 176*sc* of the second portion 176 of the first contact 170. The fourth side wall 170*sd* of the first contact 170 may include a fourth side wall 175*sd* of the first portion 175 of the first contact 170 and a fourth side wall 176*sd* of the second portion 176 of the first contact 170.

The second portion 176 of the first contact 170 may protrude from the extension line 175*sc*_EL of the third side wall 175*sc* of the first portion 175 of the first contact 170 in the second direction Y1. The second portion 176 of the first contact 170 may protrude from the extension line 175*sd*_EL of the fourth side wall 175*sd* of the first portion 175 of the first contact 170 in the second direction Y1.

The extension line 175*sc*_EL of the third side wall 175*sc* of the first portion 175 of the first contact 170 may be in parallel with the third side wall 175*sc* of the first portion 175 of the first contact 170. In some embodiments, the extension line 175*sc*_EL of the third side wall 175*sc* of the first portion 175 of the first contact 170 may extend substantially collinearly from the third side wall 175*sc*. The extension line 175*sd*_EL of the fourth side wall 175*sd* of the first portion 175 of the first contact 170 may be in parallel with the fourth side wall 175*sd* of the first portion 175 of the first contact 170. In some embodiments, the extension line 175*sd*_EL of the fourth side wall 175*sd* of the first portion 175 of the first contact 170 may extend substantially collinearly from the fourth side wall 175*sd*.

Although it is shown in FIG. 5 that the width of the second portion 176 of the first contact 170 protruding from the extension line 175*sc*_EL of the third side wall 175*sc* of the first portion 175 of the first contact 170 in the second direction Y1 is equal to the width of the second portion 176 of the first contact 170 protruding from the extension line 175*sd*_EL of the fourth side wall 175*sd* of the first portion 175 of the first contact 170 in the second direction Y1, the technical idea of the present inventive concepts is not limited thereto.

Figure 7:
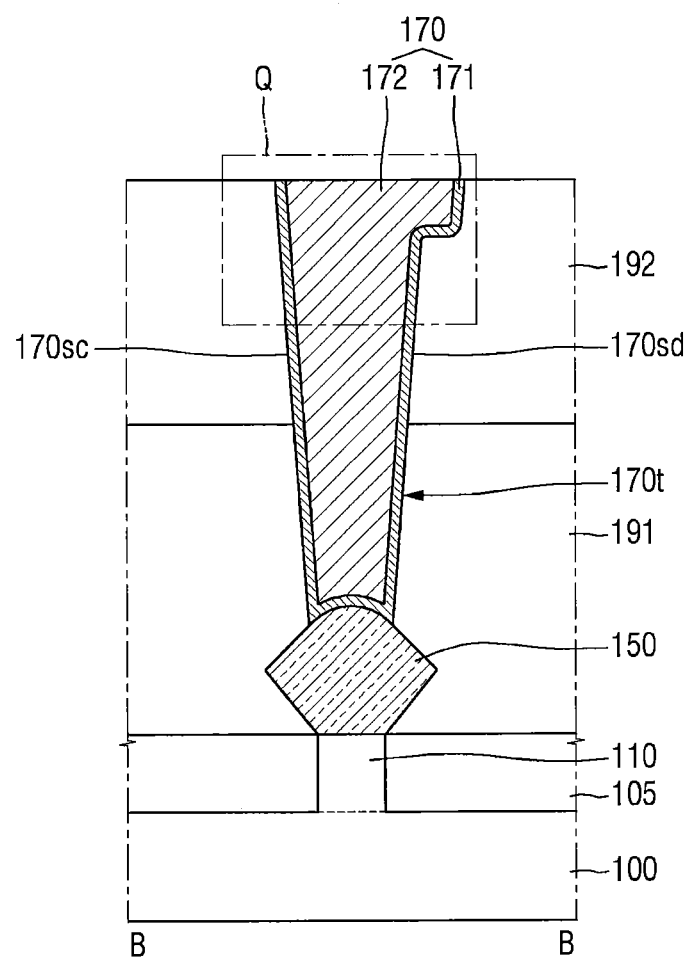
FIG. 7 is a cross-sectional view of a semiconductor device according to an embodiment of the present inventive concepts.
Figure 8:
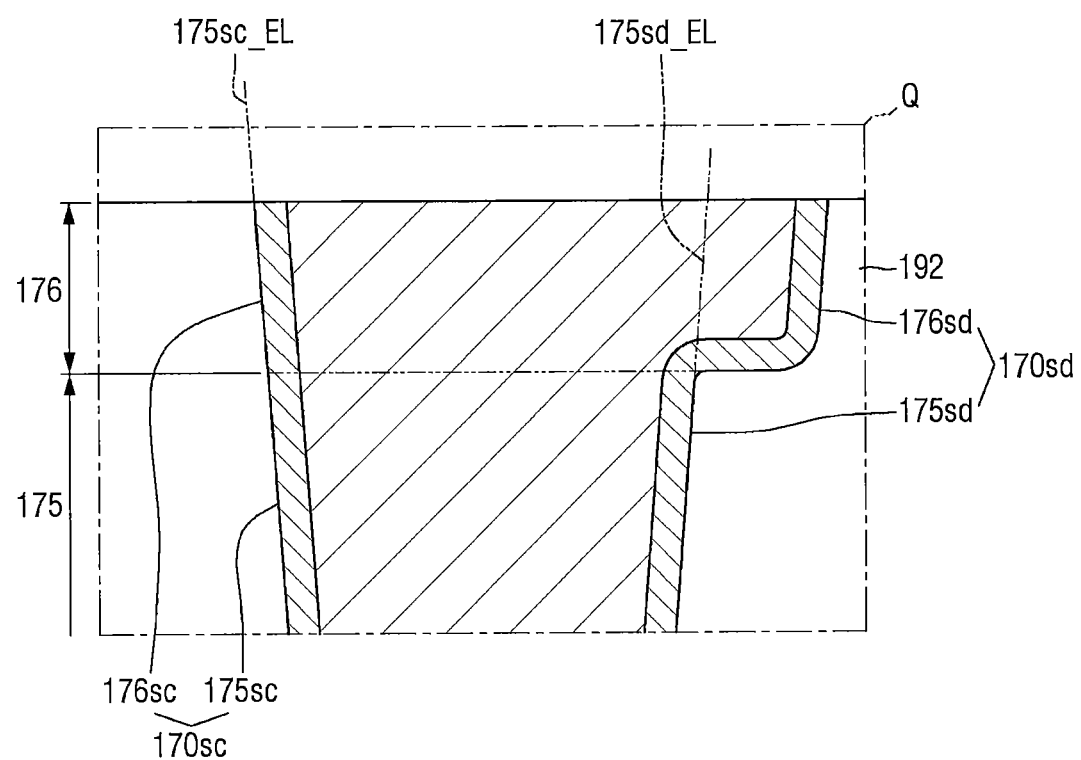
FIG. 8 is an enlarged view of the portion Q of FIG. 7.

FIG. 7 is a cross-sectional view of a semiconductor device according to an embodiment of the present inventive concepts. FIG. 8 is an enlarged view of the portion Q of FIG. 7. For convenience of explanation, differences with respect to FIGS. 1 to 6 will be mainly described.

For reference, FIG. 7 may be arranged similarly to a cross-sectional view taken along the line B-B in FIG. 1.

Referring to FIGS. 7 and 8, in a semiconductor device according to some embodiments of the present inventive concepts, the third side wall 170*sc* of the first contact 170 and the fourth side wall 170*sd* of the first contact 170 may be asymmetric with each other.

For example, the second portion 176 of the first contact 170 may not protrude from the extension line 175*sc*_EL of the third side wall 175*sc* of the first portion 175 of the first contact 170 in the second direction Y1. However, the second portion 176 of the first contact 170 may protrude from the extension line 175*sd*_EL of the fourth side wall 175*sd* of the first portion 175 of the first contact 170 in the second direction Y1.

Figure 9:
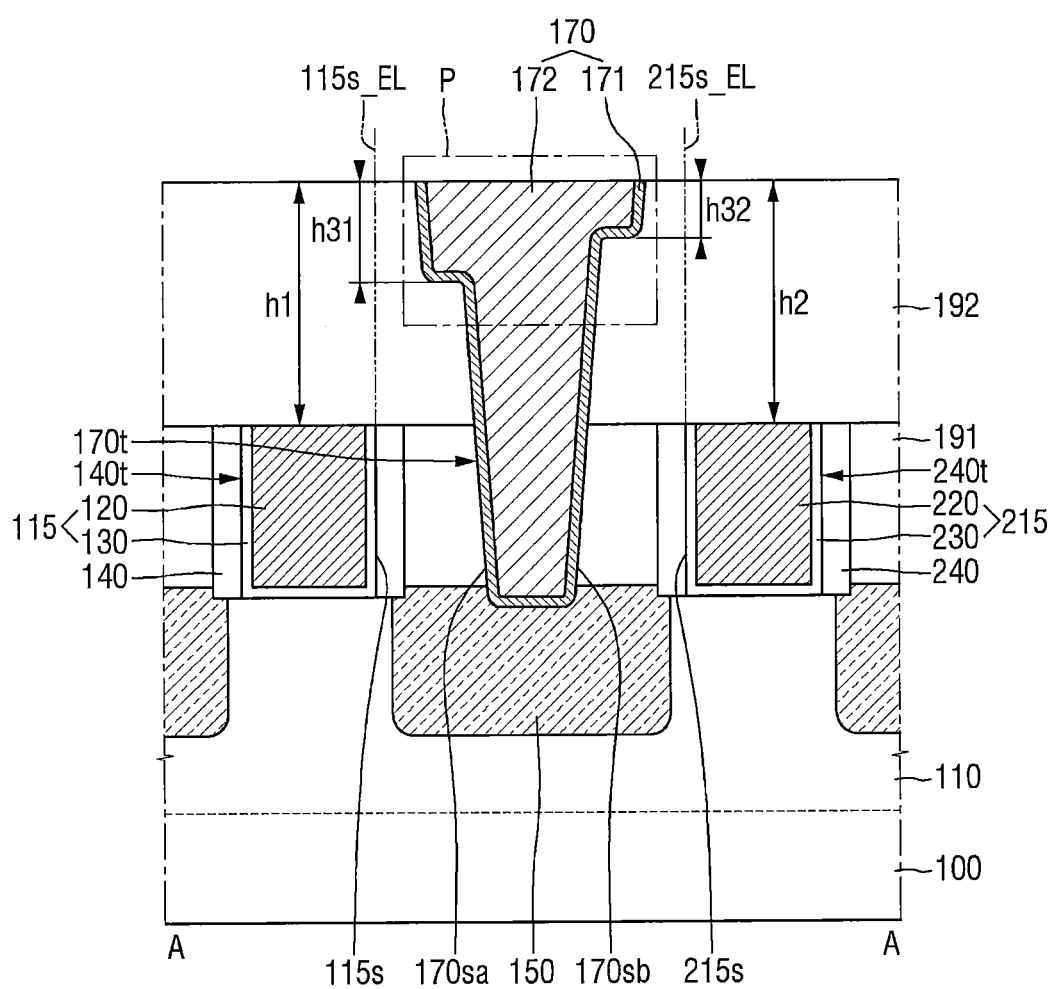
FIG. 9 is a cross-sectional view of a semiconductor device according to an embodiment of the present inventive concepts.
Figure 10:
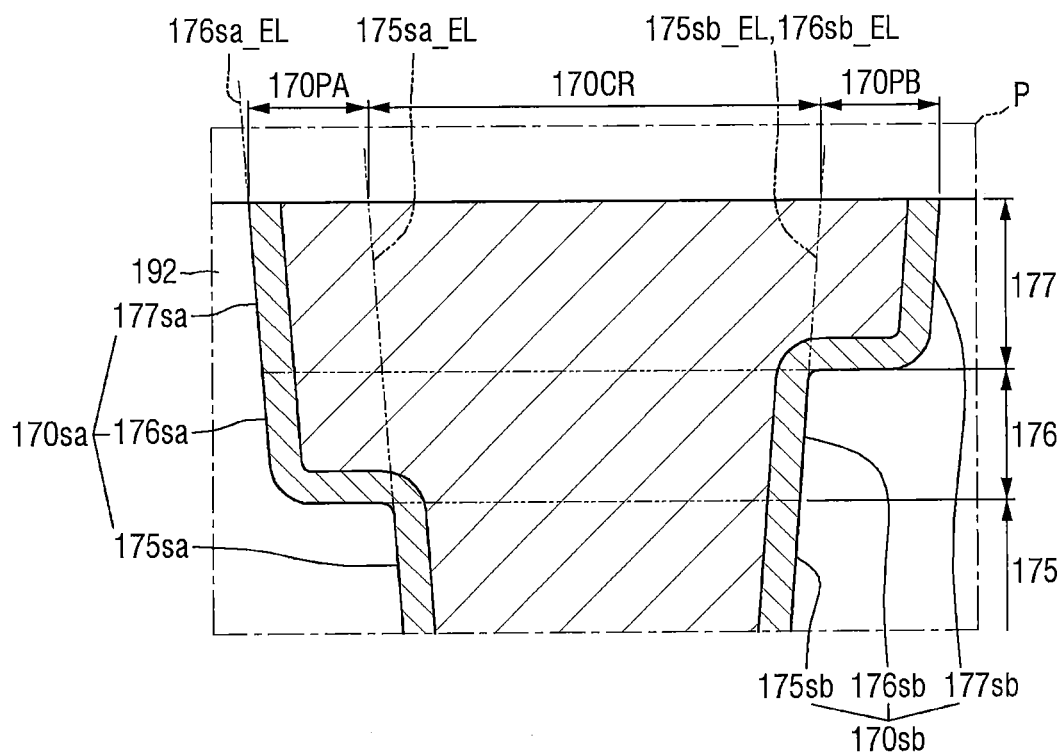
FIG. 10 is an enlarged view of the portion P of FIG. 9.

FIG. 9 is a cross-sectional view for explaining a semiconductor device according to another embodiment of the present inventive concept. FIG. 10 is an enlarged view of the portion P of FIG. 9. For convenience of explanation, differences from the semiconductor device described with reference to FIGS. 1 to 6 will be mainly described.

For reference, FIG. 9 may be arranged similarly to a cross-sectional view taken along the line A-A in FIG. 1.

Referring to FIGS. 9 and 10, in a semiconductor device according to some embodiments of the present inventive concepts, the first contact 170 may further include a third portion 177 on the second portion 176 of the first contact 170.

The first side wall 170*sa* of the first contact 170 may include a first side wall 175*sa* of the first portion 175 of the first contact 170, a first side wall 176*sa* of the second portion 176 of the first contact 170, and a first side wall 177*sa* of the third portion 177 of the first contact 170. The second side wall 170*sb* of the first contact 170 may include a second side wall 175*sb* of the first portion 175 of the first contact 170, a second side wall 176*sb* of the second portion 176 of the first contact 170, and a second side wall 177*sb* of the third portion 177 of the first contact 170.

The third portion 177 of the first contact 170 may not protrude from the extension line 176*sa*_EL of the first side wall 176*sa* of the second portion 176 of the first contact 170 in the first direction X1. In other words, the third portion 177 of the first contact 170 may not protrude from the extension line 176*sa*_EL of the first side wall 176*sa* of the second portion 176 of the first contact 170 toward the side wall 115*s* of the first gate structure 115 in the first direction X1.

In contrast, the third portion 177 of the first contact 170 may protrude from the extension line 176*sb*_EL of the second side wall 176*sb* of the second portion 176 of the first contact 170 in the first direction X1. In other words, the third portion 177 of the first contact 170 may protrude from the extension line 176*sb*_EL of the second side wall 176*sb* of the second portion 176 of the first contact 170 toward the side wall 215*s* of the second gate structure 215 in the first direction X1.

The extension line 176*sa*_EL of the first side wall 176*sa* of the second portion 176 of the first contact 170 may be in parallel with the first side wall 176*sa* of the second portion 176 of the first contact 170. In some embodiments, the extension line 176*sa*_EL of the first side wall 176*sa* of the second portion 176 of the first contact 170 may be extend substantially collinearly from the first side wall 176*sa*. The extension line 176*sb*_EL of the second side wall 176*sb* of the second portion 176 of the first contact 170 may be in parallel with the second side wall 176*sb* of the second portion 176 of the first contact 170. In some embodiments, the extension line 176*sb*_EL of the second side wall 176*sb* of the second portion 176 of the first contact 170 may extend substantially collinearly from the second side wall 176sb.

Although it is shown in FIG. 10 that the extension line 176sa_EL of the first side wall 176sa of the second portion 176 of the first contact 170 is aligned on the same line as the first side wall 177sa of the third portion 177 of the first contact 170, the present inventive concepts are not limited thereto. Further, although it is shown in FIG. 10 that the extension line 175sb_EL of the second side wall 175sb of the first portion 175 of the first contact 170 is aligned on the same line as the extension line 176sb_EL of the second side wall 176sb of the second portion 176 of the first contact 170, the present inventive concepts are not limited thereto.

The second portion 176 of the first contact 170 and the third portion 177 of the first contact 170 may not be disposed between the side wall 115s of the first gate structure 115 and the side wall 215s of the second gate structure 215, and may be disposed between the extension line 115s_EL of the side wall 115s of the first gate structure 115 and the extension line 215s_EL of the side wall 215s of the second gate structure 215. The second portion 176 of the first contact 170 and the third portion 177 of the first contact 170 may be disposed only in the upper interlayer insulating film 192. That is, the second portion 176 of the first contact 170 and the third portion 177 of the first contact 170 may be disposed above the upper surface of the first gate structure 115 and the upper surface of the second gate structure 215.

In the semiconductor device according to some embodiments of the present inventive concepts, the height h31 from the lowermost portion of the second portion 176 of the first contact 170 to the upper surface of the first contact 170 may be smaller than the height h1 from the upper surface of the first gate structure 115 to the upper surface of the first contact 170. Further, the height h32 from the lowermost portion of the third portion 177 of the first contact 170 to the upper surface of the first contact 170 may be smaller than the height h2 from the upper surface of the second gate structure 215 to the upper surface of the first contact 170.

In other words, the first contact may include a central portion 170CR, a first protrusion portion 170PA protruding from the central portion 170CR, and a second protrusion portion 170PB protruding from the central portion 170CR.

The first protrusion portion 170PA of the first contact 170 may be disposed only in the upper interlayer insulating film 192. The first protrusion portion 170PA of the first contact 170 may protrude from the central portion 170CR of the first contact 170 toward the first gate structure 115 in the first direction X1.

The second protrusion portion 170PB of the first contact 170 may be disposed only in the upper interlayer insulating film 192. The second protrusion portion 170PB of the first contact 170 may protrude from the central portion 170CR of the first contact 170 toward the second gate structure 215 in the first direction X1.

In some embodiments, the height h31 may correspond to a height of the first protrusion portion 170PA of the first contact 170 and the height h32 may correspond to a height of the second protrusion portion 170PB of the first contact 170. In the semiconductor device according to some embodiments of the present inventive concepts, the height h31 of the first protrusion portion 170PA of the first contact 170 may be different from the height h32 of the second protrusion portion 170PB of the first contact 170. For example, the height h31 of the first protrusion portion 170PA of the first contact 170 may be larger than the height h32 of the second protrusion portion 170PB of the first contact 170.

Further, the height h31 of the first protrusion portion 170PA of the first contact 170 may be smaller than the distance h1 from the upper surface of the first contact 170 to the upper surface of the first gate structure 115. The height h32 of the second protrusion portion 170PB of the first contact 170 may be smaller than the distance h2 from the upper surface of the first contact 170 to the upper surface of the second gate structure 215.

In a cross-sectional view of the first contact 170 taken in the second direction Y1, similarly to the first side wall 170sa of the first contact 170, the side wall of the second portion 176 of the first contact 170 and the side wall of the third portion 177 of the first contact 170 may protrude from an extension line of the side wall of the first portion 175 of the first contact 170 in the second direction Y1. Or, similarly to the second side wall 170sb of the first contact 170, the side wall of the third portion 177 of the first contact 170 may protrude from an extension line of the side wall of the first portion 175 of the first contact 170 and an extension line of the side wall of the second portion 176 of the first contact 170 in the second direction Y1.

Figure 11:
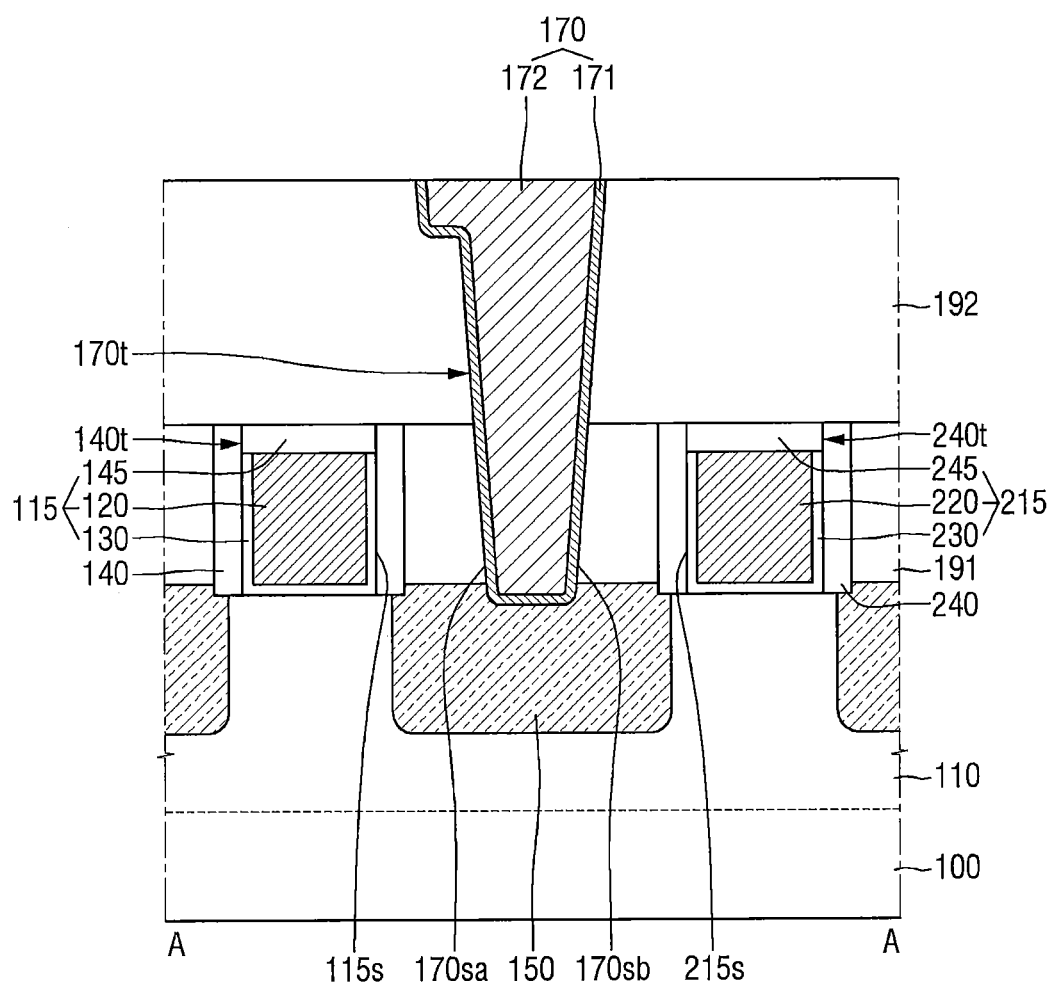
FIG. 11 is a cross-sectional view for explaining a semiconductor device according to another embodiment of the present inventive concept.

FIG. 11 is a cross-sectional view of a semiconductor device according to an embodiment of the present inventive concepts. For convenience of explanation, differences from the semiconductor device described with reference to FIGS. 1 to 6 will be mainly described.

Referring to FIG. 11, in a semiconductor device according to some embodiments of the present inventive concepts, the first gate structure 115 may include a first capping pattern 145, and the second gate structure 215 may include a second capping pattern 245.

The first gate electrode 120 may fill a part of the first trench 140t. The first capping pattern 145 may be formed on the first gate electrode 120. The first capping pattern 145 may be within, and, in some embodiments, fill, the remainder of the first trench 140t remaining after the first gate electrode 120 and/or the first gate insulating film 130 are formed.

The second gate electrode 220 may fill a part of the second trench 240t. The second capping pattern 245 may be formed on the second gate electrode 220. The second capping pattern 245 may be within, and, in some embodiments, fill, the remainder of the second trench 240t remaining after the second gate electrode 220 and/or the second gate insulating film 230 are formed.

Although it is shown in FIG. 11 that the first gate insulating film 130 is not formed between the first gate spacer 140 and the first capping pattern 145 and that the second gate insulating film 230 is not formed between the second gate spacer 240 and the second capping pattern 245, the present inventive concepts are not limited thereto.

The upper surface of the first capping pattern 145 and the upper surface of the second capping pattern 245 may be flush with the upper surface of the lower interlayer insulating film 191, respectively.

The first capping pattern 145 and the second capping pattern 245 may include a material having an etching selectivity to the lower interlayer insulating film 191. For example, the first capping pattern 145 and the second capping pattern 245 may include at least one selected from silicon nitride (SiN), silicon oxynitride (SiON), silicon oxide ($SiO_2$), silicon carbonitride (SiCN), silicon oxycarbonitride (SiOCN), and combinations thereof.

Figure 12:
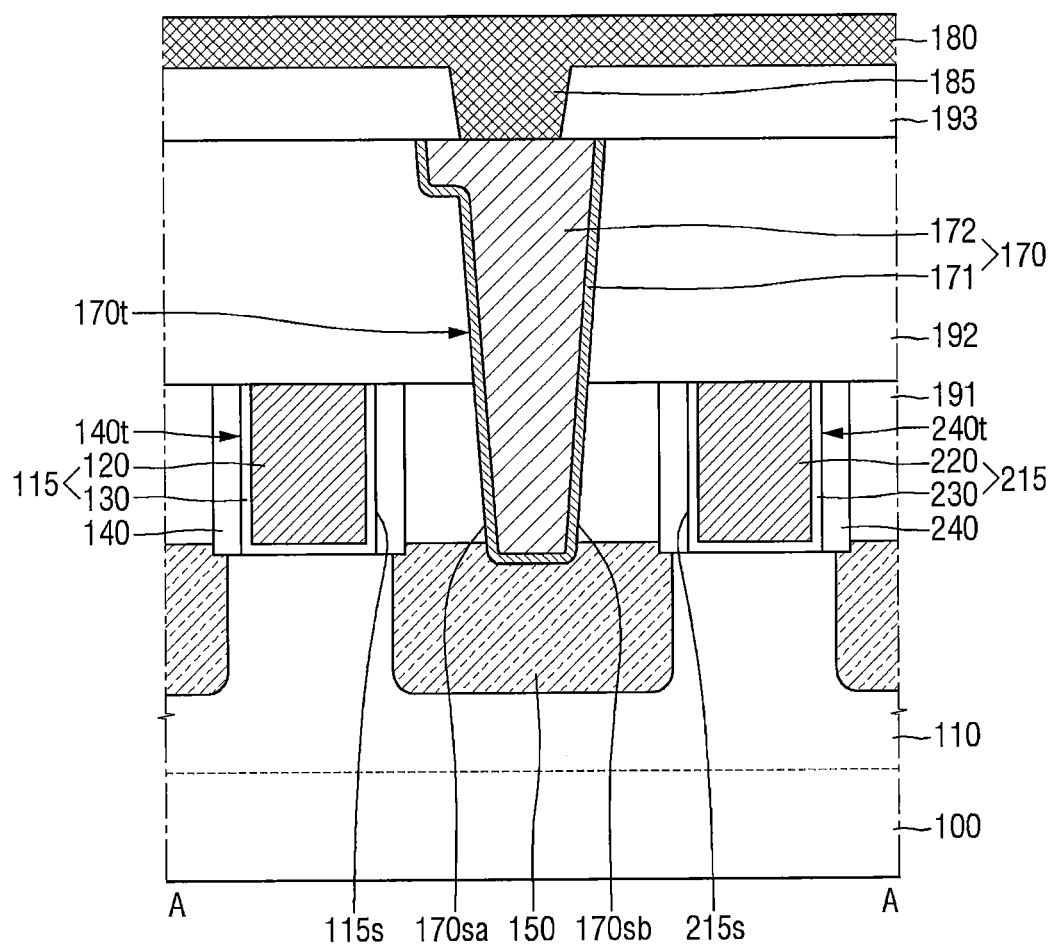
FIG. 12 is a cross-sectional view of a semiconductor device according to an embodiment of the present inventive concepts.

FIG. 12 is a cross-sectional view of a semiconductor device according to an embodiment of the present inventive concepts. For convenience of explanation, differences from the semiconductor device described with reference to FIGS. 1 to 6 will be mainly described.

Referring to FIG. 12, the semiconductor device according to some embodiments of the present inventive concepts may further include a wiring line 180 connected to the first contact 170.

The wiring line 180 may include a conductive material. The wiring line 180 may be electrically connected to the first contact 170 through a via 185.

The wiring line 180 and the via 185 may be formed in the wiring insulating film 193. The wiring insulating film 193 may be disposed on the upper interlayer insulating film 192. The wiring insulating film 193 may include an insulating material.

Although it is shown in FIG. 12 that the wiring line 180 extends in the first direction X1, the configuration is only for convenience of explanation, and is not limited thereto.

Figure 13:
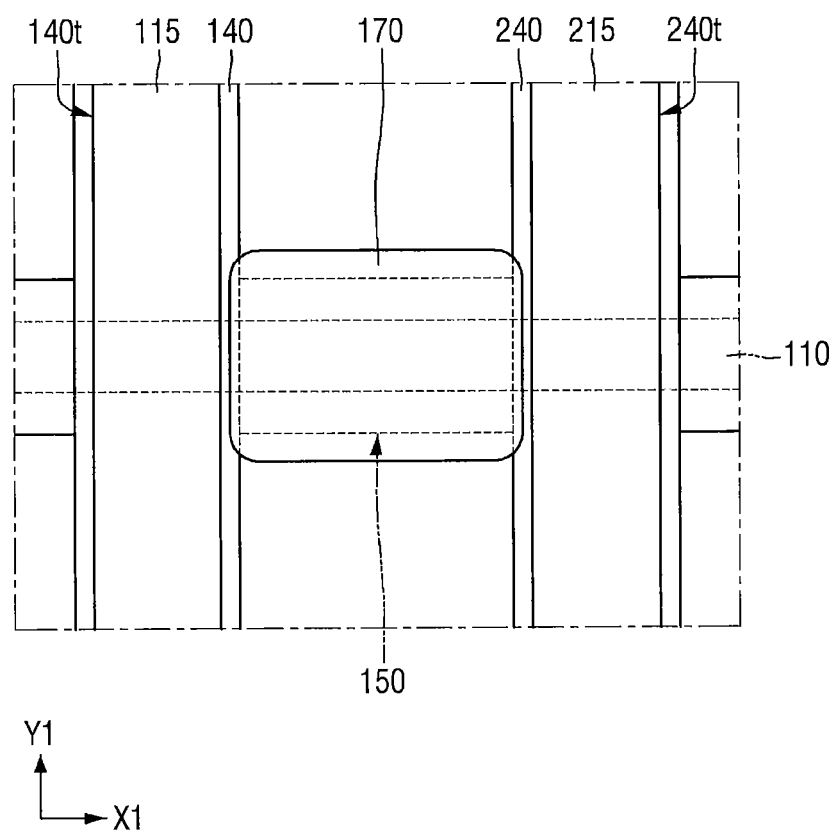
FIG. 13 is a plan view of a semiconductor device according to an embodiment of the present inventive concepts.

FIG. 13 is a plan view of a semiconductor device according to an embodiment of the present inventive concepts. For convenience of explanation, differences from the semiconductor device described with reference to FIGS. 1 to 6 will be mainly described.

Referring to FIG. 13, in the semiconductor device according to some embodiments of the present inventive concepts, the first contact 170 may vertically overlap a part of the first gate spacer 140 and a part of the second gate spacer 240.

From the viewpoint of a plan view, the first contact 170 may include a portion overlapping the top surface of the first gate spacer 140 and the top surface of the second gate spacer 240.

Figure 14:
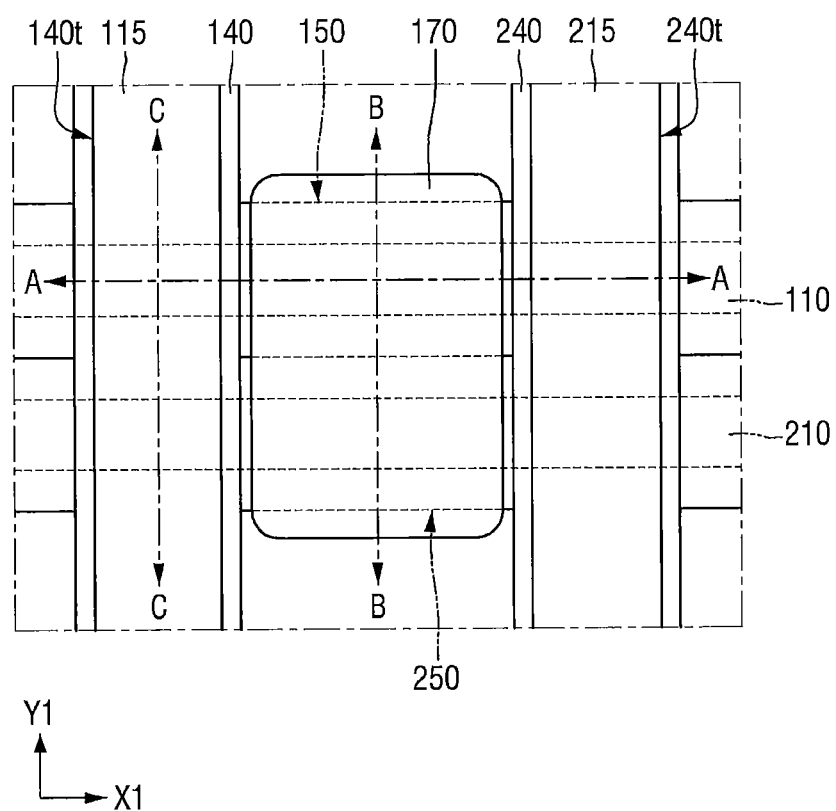
FIG. 14 is a plan view of a semiconductor device according to an embodiment of the present inventive concepts.
Figure 15:
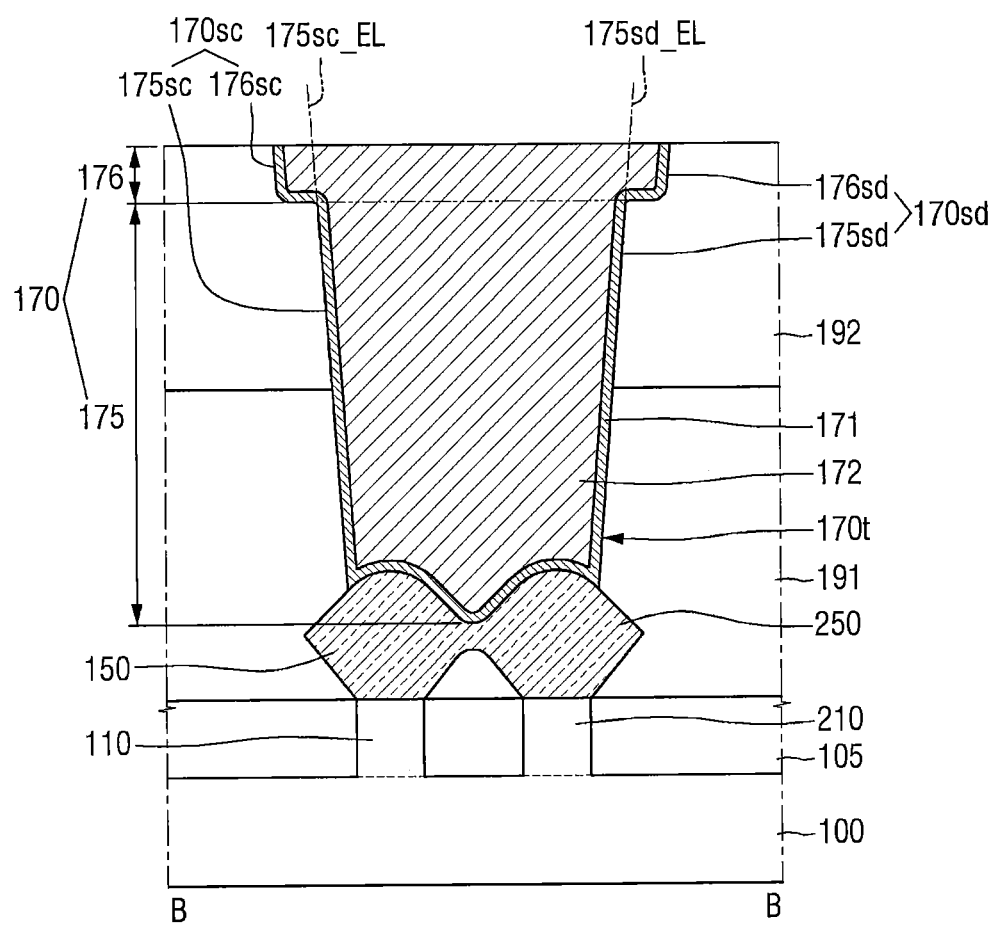
FIG. 15 is a cross-sectional view taken along the line B-B of FIG. 14.
Figure 16:
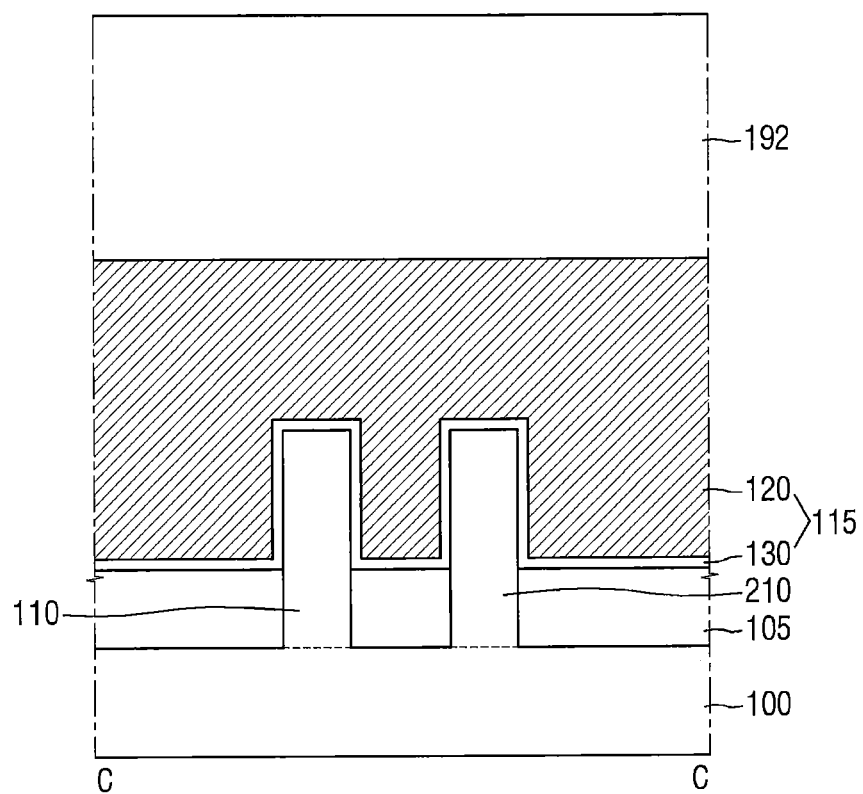
FIG. 16 is a cross-sectional view taken along the line C-C of FIG. 14.

FIG. 14 is a plan view of a semiconductor device according to an embodiment of the present inventive concepts. FIG. 15 is a cross-sectional view taken along the line B-B of FIG. 14. FIG. 16 is a cross-sectional view taken along the line C-C of FIG. 14. For convenience of explanation, differences from the semiconductor device described with reference to FIGS. 1 to 6 will be mainly described.

For reference, the cross-sectional view taken along line A-A in FIG. 14 may be substantially the same as FIG. 2.

Referring to FIGS. 14 to 16, the semiconductor device according to some embodiments of the present inventive concepts may further include a second fin-shaped pattern 210 and a second source/drain 250.

The second fin-shaped pattern 210 may protrude from the substrate 100. At least a part of the second fin-shaped pattern 210 may protrude above the field insulating film 105. The second fin-shaped pattern 210 may be defined by the field insulating film 105, and may extend along the first direction X1.

The first fin-shaped pattern 110 and the second fin-shaped pattern 210 may be formed adjacent to each other. The second fin-shaped pattern 210 may extend in a length direction (e.g., the first direction X1) in parallel with the first fin-shaped pattern 110. The long side of the second fin-shaped pattern 210 and the long side of the first fin-shaped pattern 110 may face each other. The first fin-shaped pattern 110 and the second fin-shaped pattern 210 may be arranged in the second direction Y1.

The first gate structure 115 and the second gate structure 215 may each be formed on the first fin-shaped pattern 110 and the second fin-shaped pattern 210. The first and second gate insulating films 130 and 230 may each be formed along the profile of portions of the second fin-shaped pattern 210 protruding above the field insulating film 105 and the upper surface of the field insulating film 105. The first and second gate electrodes 120 and 220 may cover portions of the second fin-shaped pattern 210 protruding above the upper surface of the field insulating film 105.

The second source/drain 250 may be formed between and/or adjacent the first gate structure 115 and the second gate structure 215. The second source/drain 250 may include an epitaxial pattern grown by using an epitaxial process. The second source/drain 250 may be disposed on the second fin-shaped pattern 210.

Although it is shown in FIG. 15 that the second source/drain 250 is in contact with the first source/drain 150, the present inventive concepts are not limited thereto.

The first contact 170 may be formed on the first source/drain 150 and the second source/drain 250. The first contact 170 may be electrically and/or physically connected with the first source/drain 150 and the second source/drain 250.

In the cross-sectional view taken in the second direction Y1, the first contact 170 may include a third side wall 170sc and a fourth side wall 170sd, facing each other. The third side wall 170sc of the first contact 170 may extend from the first source/drain 150, and the fourth side wall 170sd of the first contact 170 may extend from the second source/drain 250.

The second portion 176 of the first contact 170 may protrude from the extension line 175sc_EL of the third side wall 175sc of the first portion 175 of the first contact 170 in the second direction Y1. The second portion 176 of the first contact 170 may protrude from the extension line 175sc_EL of the third side wall 175sc of the first portion 175 of the first contact 170 in a direction away from the second fin-shaped pattern 210.

The second portion 176 of the first contact 170 may protrude from the extension line 175sd_EL of the fourth side wall 175sd of the first portion 175 of the first contact 170 in the second direction Y1. The second portion 176 of the first contact 170 may protrude from the extension line 175sd_EL of the fourth side wall 175sd of the first portion 175 of the first contact 170 in a direction away from the first fin-shaped pattern 110.

Although it is shown in FIG. 15 that the width of the second portion 176 of the first contact 170 protruding from the extension line 175sc_EL of the third side wall 175sc of the first portion 175 of the first contact 170 in the second direction Y1 is equal to the width of the second portion 176 of the first contact 170 protruding from the extension line 175sd_EL of the fourth side wall 175sd of the first portion 175 of the first contact 170 in the second direction Y1, the technical idea of the present inventive concepts is not limited thereto.

Figure 17:
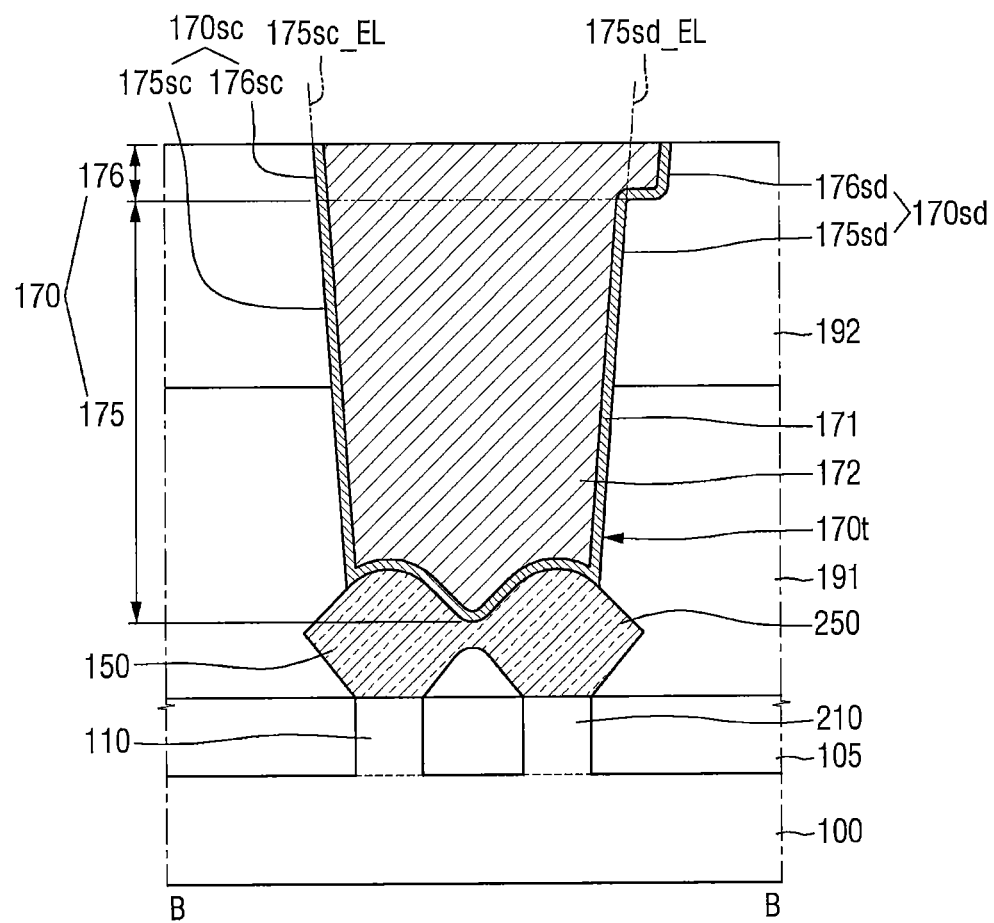
FIG. 17 is a cross-sectional view of a semiconductor device according to an embodiment of the present inventive concepts.

FIG. 17 is a cross-sectional view of a semiconductor device according to an embodiment of the present inventive concepts. For convenience of explanation, differences from the semiconductor device described with reference to FIGS. 14 to 16 will be mainly described.

Referring to FIG. 17, in the semiconductor device according to some embodiments of the present inventive concepts, the third side wall 170sc of the first contact 170 and the fourth side wall 170sd of the first contact 170 may be asymmetric with each other.

For example, the second portion 176 of the first contact 170 may not protrude from the extension line 175sc_EL of the third side wall 175sc of the first portion 175 of the first contact 170 in the second direction Y1.

In contrast, the second portion 176 of the first contact 170 may protrude from the extension line 175sd_EL of the fourth side wall 175sd of the first portion 175 of the first contact 170 in the second direction Y1.

Although it is described with reference to FIGS. 14 to 17 that the first contact 170 includes the first portion 175 of the first contact 170 and the second portion 176 of the first contact 170, the present inventive concepts are not limited thereto. As shown in FIGS. 9 and 10, the first contact 170 may further include the third portion 177 of the first contact 170.

Figure 18:
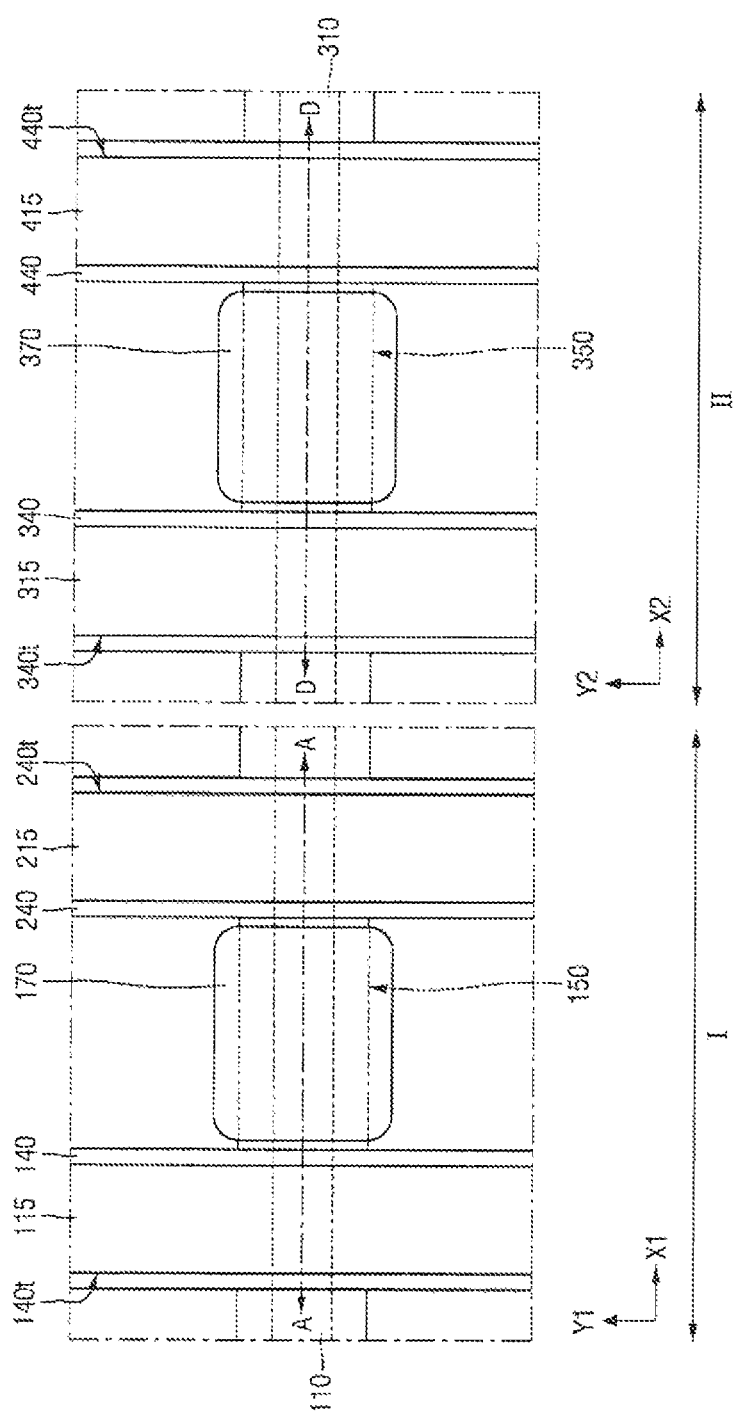
FIG. 18 is a plan view of a semiconductor device according to an embodiment of the present inventive concepts.
Figure 19:
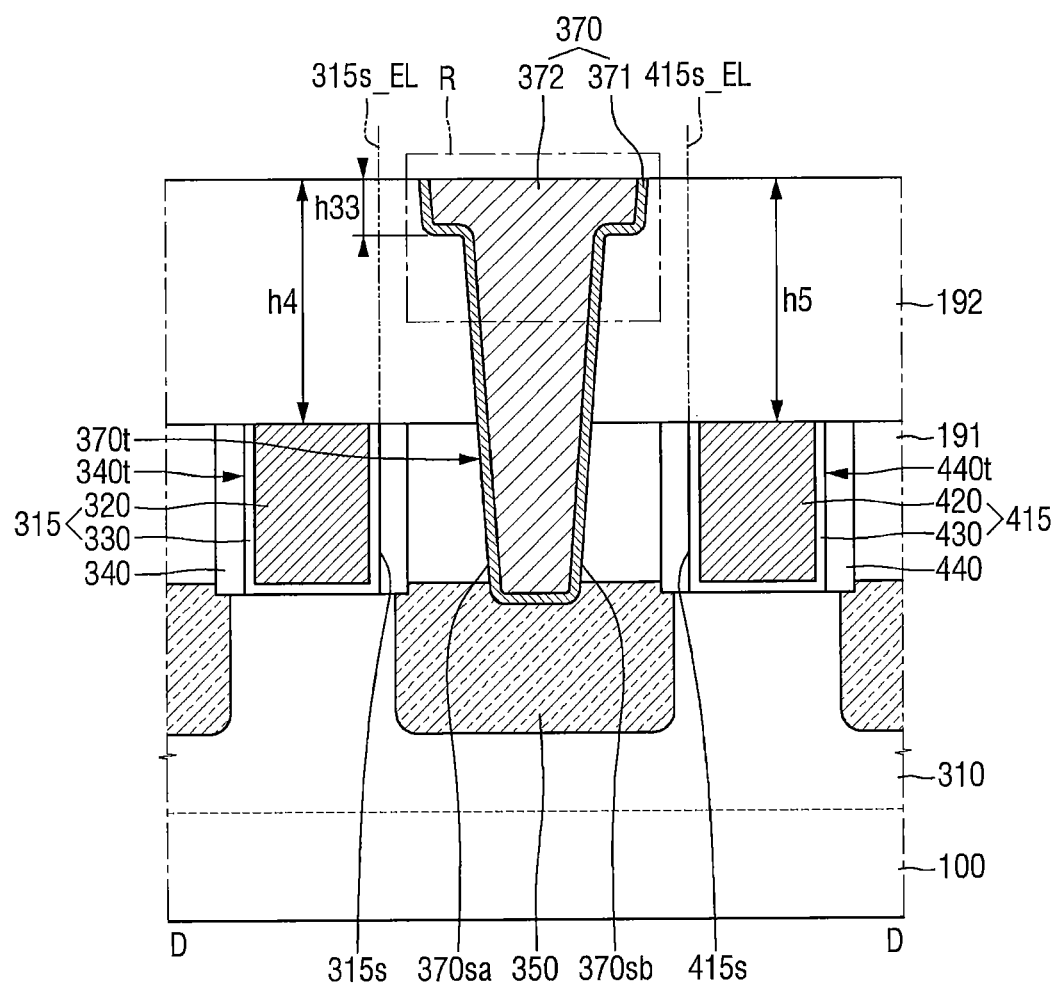
FIG. 19 is a cross-sectional view taken along the line D-D of FIG. 18.
Figure 20:
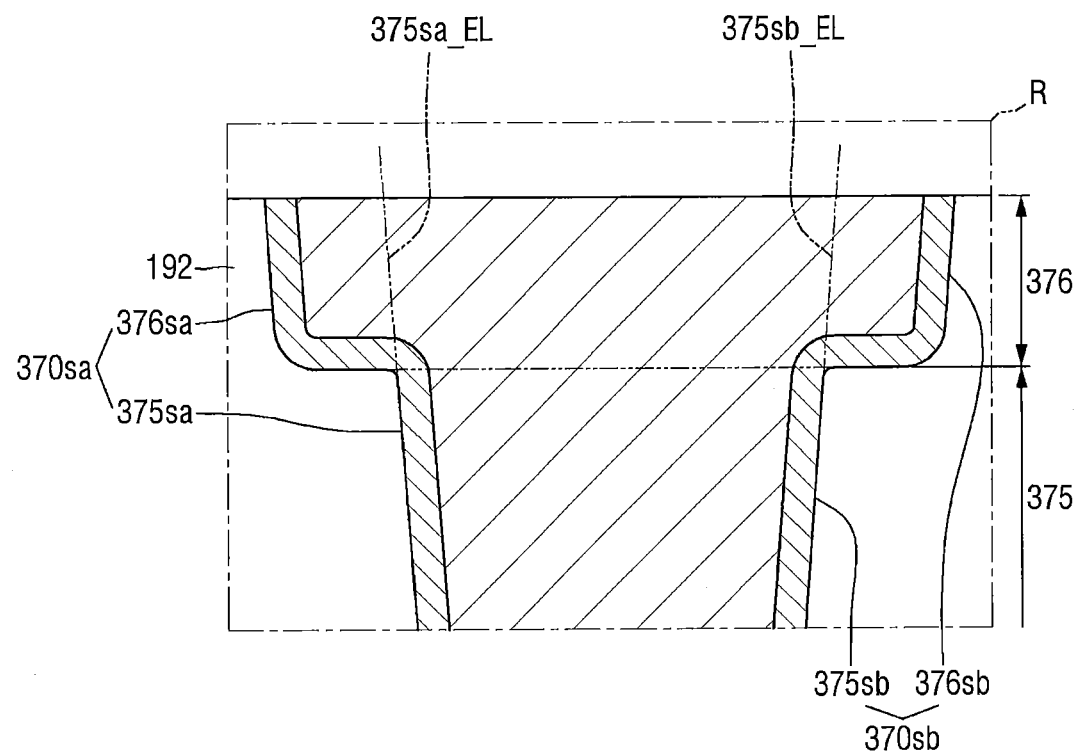
FIG. 20 is an enlarged view of the portion R of FIG. 19.

FIG. 18 is a plan view of a semiconductor device according to an embodiment of the present inventive concepts. FIG. 19 is a cross-sectional view taken along the line D-D of FIG. 18. FIG. 20 is an enlarged view of the portion R of FIG. 19. For convenience of explanation, differences from the semiconductor device described with reference to FIGS. 1 to 6 will be mainly described.

Further, the cross-sectional view taken along line A-A in FIG. 18 may be substantially the same as any one of FIGS. 2 and 9.

Referring to FIGS. 18 to 20, a semiconductor device according to an embodiment of the present inventive concepts may include a first fin-shaped pattern 110, a third fin-shaped pattern 310, a first gate structure 115, a second gate structure 215, a third gate structure 315, a fourth gate structure 415, a first gate spacer 140, a second gate spacer 240, a third gate spacer 340, a fourth gate spacer 440, a first source/drain 150, a third source/drain 350, a first contact 170, and a second contact 370.

The substrate 100 may include a first area I and a second area II. The first area I and the second area II may be spaced apart from each other, or may be connected to each other. For reference, since a description of the first area I in FIG. 18 is substantially the same as that described with reference to FIGS. 1 to 6, contents shown in the second area II of FIG. 19 will be mainly described.

In the first area I, the first fin-shaped pattern 110, the first gate structure 115, the second gate structure 215, the first gate spacer 140, the second gate spacer 240, the first source/drain 150, and the first contact 170 may be formed.

In the second area II, the third fin-shaped pattern 310, the third gate structure 315, the fourth gate structure 415, the third gate spacer 340, the fourth gate spacer 440, the third source/drain 350, and the second contact 370 may be formed.

The third fin-shaped pattern 310 may protrude from the substrate 100. The third fin-shaped pattern 310 may be defined by the field insulating film 105. The third fin-shaped pattern 310 may extend along a third direction X2. Like the first fin-shaped pattern 110, the third fin-shaped pattern 310 may include various semiconductor materials. However, in the semiconductor device according to some embodiments of the present inventive concepts, it is described that the third fin-shaped pattern 310 is a silicon fin-shaped pattern including silicon.

The lower interlayer insulating film 191 may include a first trench 140*t* and a second trench 240*t* adjacent to each other in the first area I. The lower interlayer insulating film 191 may include a third trench 340*t* and a fourth trench 440*t* adjacent to each other in the second area II.

The third trench 340*t* and the fourth trench 440*t* may extend in a fourth direction Y2. The third trench 340*t* and the fourth trench 440*t* may intersect the third fin-shaped pattern 310.

The third gate spacer 340 and the fourth gate spacer 440 may be formed on the third fin-shaped pattern 310. The third gate spacer 340 and the fourth gate spacer 440 may extend in the fourth direction Y2, respectively.

The third gate spacer 340 may define the third trench 340*t*. The fourth gate spacer 440 may define the fourth trench 440*t*.

The third gate structure 315 may be formed in the third trench 340*t*. The third gate structure 315 may be within, and in some embodiments, fill, the third trench 340*t*. The third gate structure 315 may extend along the fourth direction Y2.

The third gate structure 315 may be formed on the third fin-shaped pattern 310. The third gate structure 315 may intersect the third fin-shaped pattern 310. The third gate structure 315 may include a third gate insulating film 330 and a third gate electrode 320.

The fourth gate structure 415 may be formed in the fourth trench 440*t*. The fourth gate structure 415 may be within, and in some embodiments, fill, the fourth trench 440*t*. The fourth gate structure 415 may extend along the fourth direction Y2.

The fourth gate structure 415 may be formed on the third fin-shaped pattern 310. The fourth gate structure 415 may intersect the third fin-shaped pattern 310. The fourth gate structure 415 may include a fourth gate insulating film 430 and a fourth gate electrode 420.

The third source/drain 350 may be formed between the third gate structure 315 and the fourth gate structure 415. The third source/drain 350 may include an epitaxial pattern grown by using an epitaxial process. The third source/drain 350 may be disposed on the third fin-shaped pattern 310.

The second contact 370 may be formed on the third source/drain 350. The second contact 370 may be electrically and/or physically connected to the third source/drain 350.

The second contact 370 may be formed in the upper interlayer insulating film 192 and the lower interlayer insulating film 191. The second contact 370 may be within, and in some embodiments, fill, a second contact hole 370*t* formed in the upper interlayer insulating film 192 and the lower interlayer insulating film 191.

The second contact 370 may include a second barrier conductive film 371 and a second filling conductive film 372. The second filling conductive film 372 may be formed on the second barrier conductive film 371.

The second contact 370 may be disposed between the side wall 315*s* of the third gate structure 315 and the side wall 415*s* of the fourth gate structure 415 and between the extension line 315*s*_EL of the side wall 315*s* of the third gate structure 315 and the extension line 415*s*_EL of the side wall 415*s* of the fourth gate structure 415. A part of the second contact 370 may be disposed between the side wall 315*s* of the third gate structure 315 and the side wall 415*s* of the fourth gate structure 415, and the remainder of the second contact 370 may be disposed between the extension line 315*s*_EL of the side wall 315*s* of the third gate structure 315 and the extension line 415*s*_EL of the side wall 415*s* of the fourth gate structure 415.

From the viewpoint of a plan view, the second contact 370 may not overlap the third gate structure 315 and the fourth gate structure 415. Further, the second contact 370 may not overlap at least a part of the third gate spacer 340 and at least a part of the fourth gate spacer 440.

The shape of the second contact 370 will be described with reference to the cross-sectional view taken along the third direction X2 using FIGS. 19 and 20. The cross-sectional view taken in the third direction X2 may be a view taken in a direction in which the third fin-shaped pattern 310 extends.

In the cross-sectional view taken in the third direction X2, the second contact 370 may include a first side wall 370*sa* and a second side wall 370sb, facing each other. The first side wall 370sa of the second contact 370 may be adjacent the third gate structure 315, and the second side wall 370sb of the second contact 370 may be adjacent the fourth gate structure 415. The first side wall 370sa of the second contact 370 may face the side wall 315s of the third gate structure 315, and the second side wall 370sb of the second contact 370 may face the side wall 415s of the fourth gate structure 415.

The second contact 370 may include a first portion 375 disposed on the third source/drain 350 and a second portion 376 on the first portion 375 of the second contact 370.

The first side wall 370sa of the second contact 370 may include a first side wall 375sa of the first portion 375 of the second contact 370 and a first side wall 376sa of the second portion 376 of the second contact 370. The second side wall 370sb of the second contact 370 may include a second side wall 375sb of the first portion 375 of the second contact 370 and a second side wall 376sb of the second portion 376 of the second contact 370.

The second portion 376 of the second contact 370 may protrude from the extension line 375sa_EL of the first side wall 375sa of the first portion 375 of the second contact 370 in the third direction X2. In other words, the second portion 376 of the second contact 370 may protrude from the extension line 375sa_EL of the first side wall 375sa of the first portion 375 of the second contact 370 toward the side wall 315s of the third gate structure 315 in the third direction X2.

Further, the second portion 376 of the second contact 370 may protrude from the extension line 375sb_EL of the second side wall 375sb of the first portion 375 of the second contact 370 in the third direction X2. In other words, the second portion 376 of the second contact 370 may protrude from the extension line 375sb_EL of the second side wall 375sb of the first portion 375 of the second contact 370 toward the side wall 415s of the fourth gate structure 415 in the third direction X2.

The extension line 375sa_EL of the first side wall 375sa of the first portion 375 of the second contact 370 may be in parallel with the first side wall 375sa of the first portion 375 of the second contact 370. In some embodiments, the extension line 375sa_EL of the first side wall 375sa of the first portion 375 of the second contact 370 may extend substantially collinearly from the first side wall 375sa. The extension line 375sb_EL of the second side wall 375sb of the first portion 375 of the second contact 370 may be in parallel with the second side wall 375sb of the first portion 375 of the second contact 370. In some embodiments, the extension line 375sb_EL of the second side wall 375sb of the first portion 375 of the second contact 370 may extend substantially collinearly from the second side wall 375sb.

The first portion 375 of the second contact 370 may be disposed between the side wall 315s of the third gate structure 315 and the side wall 415s of the fourth gate structure 415 and between the extension line 315s_EL of the side wall 315s of the third gate structure 315 and the extension line 415s_EL of the side wall 415s of the fourth gate structure 415. The first portion 375 of the second contact 370 may be disposed in the lower interlayer insulating film 191 and the upper interlayer insulating film 192.

The second portion 376 of the second contact 370 may not be disposed between the side wall 315s of the third gate structure 315 and the side wall 415s of the fourth gate structure 415, and may be disposed between the extension line 315s_EL of the side wall 315s of the third gate structure 315 and the extension line 415s_EL of the side wall 415s of the fourth gate structure 415. The second portion 376 of the second contact 370 may be disposed only in the upper interlayer insulating film 192. That is, the second portion 376 of the second contact 370 may be disposed above the upper surface of the third gate structure 315 and the upper surface of the fourth gate structure 415.

The height h33 of the second portion 376 of the second contact 370 (e.g., the distance between a lowermost surface of the second portion 376 and an upper surface of the second contact 370) may be smaller than the distance h4 from the upper surface of the second contact 370 to the upper surface of the third gate structure 315. The height h33 of the second portion 376 of the second contact 370 may be smaller than the distance h5 from the upper surface of the second contact 370 to the upper surface of the fourth gate structure 415.

In other words, the height h4-h33 from the upper surface of the third gate structure 315 to the second portion 376 of the second contact may be greater than zero. The height h5-h33 from the upper surface of the fourth gate structure 415 to the second portion 376 of the second contact 370 may be greater than zero.

Further, the height h4-h33 from the upper surface of the third gate structure 315 to the second portion 376 of the second contact 370 may be substantially equal to the height h5-h33 from the upper surface of the fourth gate structure 415 to the second portion 376 of the second contact 370.

Although it is shown in FIG. 20 that the width of the second portion 376 of the second contact 370 protruding from the extension line 375sa_EL of the first side wall 375sa of the first portion 375 of the second contact 370 in the third direction X2 is equal to the width of the second portion 376 of the second contact 370 protruding from the extension line 375sb_EL of the second side wall 375sb of the first portion 375 of the second contact 370 in the third direction X2, the technical idea of the present inventive concepts is not limited thereto.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Although the some embodiments of the present inventive concepts have been disclosed for illustrative purposes, those skilled in the art will appreciate that various modifications, additions and substitutions are possible, without departing from the scope and spirit of the inventive concepts as disclosed in the accompanying claims.

What is claimed is:

1. A semiconductor device, comprising:
    a lower interlayer insulating film comprising a first trench and a second trench adjacent each other;
    a first gate structure within the first trench and extending in a first direction;
    a second gate structure within the second trench and extending in the first direction;
    a source/drain adjacent the first gate structure and the second gate structure;
    an upper interlayer insulating film on the lower interlayer insulating film; and
    a contact connected to the source/drain, the contact in the upper interlayer insulating film and the lower interlayer insulating film,
    wherein the contact comprises a first side wall facing the first gate structure and a second side wall that is opposite the first side wall and facing the second gate structure,
    wherein the first side wall of the contact and the second side wall of the contact are asymmetric with each other, and
    wherein the contact does not vertically overlap the first gate structure and the second gate structure.

2. The semiconductor device of claim 1, wherein the contact comprises a first portion and a second portion on the first portion,
    wherein the second portion of the contact protrudes in a second direction, crossing the first direction, from a first extension line that extends substantially collinearly from a first portion of the first side wall on the first portion of the contact, and
    wherein the second portion of the contact does not protrude in a third direction, opposite the second direction, from a second extension line that extends substantially collinearly from a first portion of the second side wall on the first portion of the contact.

3. The semiconductor device of claim 2, wherein the contact further comprises a third portion on the second portion,
    wherein the third portion of the contact does not protrude in the second direction from a third extension line that extends substantially collinearly from a second portion of the first side wall on the second portion of the contact, and
    wherein the third portion of the contact protrudes in the third direction from a fourth extension line that extends substantially collinearly from a second portion of the second side wall on the second portion of the contact.

4. The semiconductor device of claim 2, wherein a height of a lowermost surface of the second portion of the contact to an upper surface of the contact is smaller than a distance from an upper surface of the contact to an upper surface of the first gate structure.

5. The semiconductor device of claim 1, wherein the contact comprises a central portion, a first protrusion portion protruding from the central portion toward the first gate structure, and a second protrusion portion protruding from the central portion toward the second gate structure, and
    wherein a first height of a first lowermost surface of the first protrusion portion of the contact to an upper surface of the contact is different from a second height of a second lowermost surface of the second protrusion portion of the contact to the upper surface of the contact.

6. The semiconductor device of claim 5, wherein the first height of the first lowermost surface of the first protrusion portion of the contact to the upper surface of the contact is smaller than a distance from an upper surface of the contact to an upper surface of the first gate structure, and
wherein the second height of the second lowermost surface of the second protrusion portion of the contact to the upper surface of the contact is smaller than a distance from the upper surface of the contact to an upper surface of the second gate structure.

7. The semiconductor device of claim 1, wherein the first gate structure comprises a first gate insulating film extending along a side wall and a bottom surface of the first trench, and
wherein the second gate structure comprises a second gate insulating film extending along a side wall and a bottom surface of the second trench.

8. The semiconductor device of claim 1, further comprising:
a first gate spacer on a side wall of the first gate structure; and
a second gate spacer on a side wall of the second gate structure,
wherein the first gate spacer defines the first trench, and the second gate spacer defines the second trench.

9. The semiconductor device of claim 1, wherein the first gate structure comprises a first gate electrode within a part of the first trench and a first capping pattern on the first gate electrode, and
wherein the second gate structure comprises a second gate electrode within a part of the second trench and a second capping pattern on the second gate electrode.

10. The semiconductor device of claim 1, wherein the contact is an integral structure.

11. A semiconductor device, comprising:
a first fin-shape pattern on a substrate and extending in a first direction;
a lower interlayer insulating film on the substrate and comprising a first trench and a second trench, wherein each of the first trench and the second trench extends in a second direction different from the first direction and intersects the first fin-shaped pattern;
a first gate structure within the first trench;
a second gate structure within the second trench;
a first source/drain on the first fin-shape pattern and adjacent the first gate structure and the second gate structure;
an upper interlayer insulating film on the lower interlayer insulating film; and
a first contact connected to the first source/drain, the first contact in the upper interlayer insulating film and the lower interlayer insulating film,
wherein the first contact is between a side wall of the first gate structure and a side wall of the second gate structure, the side walls facing each other, and between a first line extending from the side wall of the first gate structure that is perpendicular to an upper surface of the first gate structure and a second line extending from the side wall of the second gate structure that is perpendicular to an upper surface of the second gate structure,
wherein the first contact comprises a first side wall facing the first gate structure and a second side wall facing the second gate structure,
wherein the first contact comprises a first portion and a second portion on the first portion,
wherein the second portion of the first contact protrudes towards the first gate structure from a first extension line that extends substantially collinearly from a first portion of the first side wall on the first portion of the first contact, and
wherein the second portion of the first contact does not protrude towards the second gate structure from a second extension line that extends substantially collinearly from a first portion of the second side wall on the first portion of the first contact.

12. The semiconductor device of claim 11, wherein the second portion of the first contact is between the first line extending from the side wall of the first gate structure and the second line extending from the side wall of the second gate structure.

13. The semiconductor device of claim 11, wherein the first contact further comprises a third portion on the second portion,
wherein the third portion of the first contact does not protrude towards the first gate structure from a third extension line that extends substantially collinearly from a second portion of the first side wall on the second portion of the first contact, and
wherein the third portion of the first contact protrudes towards the second gate structure from a fourth extension line that extends substantially collinearly from a second portion of the second side wall on the second portion of the first contact.

14. The semiconductor device of claim 11, further comprising:
a first gate spacer on the side wall of the first gate structure; and
a second gate spacer on the side wall of the second gate structure,
wherein the first gate spacer defines the first trench, and the second gate spacer defines the second trench, and
wherein the first contact does not vertically overlap at least a part of the first gate structure and at least a part of the second gate structure.

15. The semiconductor device of claim 11, further comprising:
a second fin-shaped pattern on the substrate and extending in a third direction;
a third gate structure on the second fin-shaped pattern and extending in a fourth direction different from the third direction;
a fourth gate structure on the second fin-shaped pattern and extending in the fourth direction;
a second source/drain on the second fin-shaped pattern and between the third gate structure and the fourth gate structure; and
a second contact connected to the second source/drain between the third gate structure and the fourth gate structure,
wherein the second contact comprises a third side wall facing the third gate structure and a fourth side wall facing the fourth gate structure,
wherein the second contact comprises a third portion and a fourth portion on the third portion,
wherein the fourth portion of the second contact protrudes towards the third gate structure from a third extension line that extends substantially collinearly from a first portion of the third side wall on the third portion of the second contact, and wherein the fourth portion of the second contact protrudes towards the fourth gate structure from a fourth extension line that extends substantially collinearly from a first portion of the fourth side wall on the third portion of the second contact.

16. The semiconductor device of claim 11, wherein the first contact comprises a third side wall and a fourth side wall facing each other along the second direction, wherein the second portion of the first contact protrudes in the second direction from a third extension line that extends substantially collinearly from a first portion of the third side wall on the first portion of the first contact, and wherein the second portion of the first contact protrudes in a third direction, opposite the second direction, from a fourth extension line that extends substantially collinearly from a first portion of the fourth side wall on the first portion of the first contact.

17. A semiconductor device, comprising:

a first fin-shaped pattern and a second fin-shaped pattern adjacent each other on a substrate, wherein the first fin-shaped pattern and the second fin-shaped pattern each extend in a first direction;

a first gate structure on the first fin-shaped pattern and the second fin-shaped pattern and extending in a second direction different from the first direction;

a second gate structure on the first fin-shaped pattern and the second fin-shaped pattern and extending in the second direction;

a first source/drain on the first fin-shaped pattern and adjacent the first gate structure and the second gate structure;

a second source/drain on the second fin-shaped pattern and adjacent the first gate structure and the second gate structure; and a contact connected to the first source/drain and the second source/drain and on the first source/drain and the second source/drain, wherein the contact is between a side wall of the first gate structure and a side wall of the second gate structure, the side walls facing each other, and between a first line extending from the side wall of the first gate structure that is perpendicular to an upper surface of the first gate structure and a second line extending from the side wall of the second gate structure that is perpendicular to an upper surface of the second gate structure, wherein the contact comprises a first side wall facing the first gate structure along the first direction and a second side wall facing the second gate structure along a third direction, opposite the first direction, wherein the contact comprises a first portion and a second portion on the first portion, wherein the second portion of the contact protrudes in the first direction from a first extension line that extends substantially collinearly from a first portion of the first side wall on the first portion of the contact, and wherein the second portion of the contact does not protrude in the third direction from a second extension line that extends substantially collinearly from a first portion of the second side wall on the first portion of the contact.

18. The semiconductor device of claim 17, wherein the contact comprises a third side wall and a fourth side wall facing each other along the second direction, wherein the second portion of the contact protrudes in the second direction from a third extension line that extends substantially collinearly from a first portion of the third side wall on the first portion of the contact, and wherein the second portion of the contact protrudes in a fourth direction, opposite the second direction, from a fourth extension line that extends substantially collinearly from a first portion of the fourth side wall on the first portion of the contact.

19. The semiconductor device of claim 17, wherein the contact further comprises a third portion on the second portion, wherein the third portion of the contact does not protrude in the first direction from a third extension line that extends substantially collinearly from a second portion of the first side wall on the second portion of the contact, and wherein the third portion of the contact protrudes in the third direction from a fourth extension line that extends substantially collinearly from a second portion of the second side wall on the second portion of the contact.

20. The semiconductor device of claim 17, wherein the contact comprises a third side wall and a fourth side wall facing each other along the second direction, wherein the second portion of the contact protrudes in the second direction from a third extension line that extends substantially collinearly from a first portion of the third side wall on the first portion of the contact, and wherein the second portion of the contact does not protrude in a fourth direction, opposite the second direction, from a fourth extension line that extends substantially collinearly from a first portion of the fourth side wall on the first portion of the contact.

\* \* \* \* \*